United States Patent
Shi et al.

(10) Patent No.: US 12,234,383 B2
(45) Date of Patent: Feb. 25, 2025

(54) LOW DISHING OXIDE CMP POLISHING COMPOSITIONS FOR SHALLOW TRENCH ISOLATION APPLICATIONS AND METHODS OF MAKING THEREOF

(71) Applicant: Versum Materials US, LLC, Tempe, AZ (US)

(72) Inventors: Xiaobo Shi, Chandler, AZ (US); Krishna P. Murella, Phoenix, AZ (US); Joseph D. Rose, Gilbert, AZ (US); Hongjun Zhou, Chandler, AZ (US); Mark Leonard O'Neill, Queen Creek, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 243 days.

(21) Appl. No.: 17/998,517

(22) PCT Filed: May 25, 2021

(86) PCT No.: PCT/US2021/034054
§ 371 (c)(1),
(2) Date: Nov. 11, 2022

(87) PCT Pub. No.: WO2021/242755
PCT Pub. Date: Dec. 2, 2021

(65) Prior Publication Data
US 2023/0193079 A1 Jun. 22, 2023

Related U.S. Application Data

(60) Provisional application No. 63/032,233, filed on May 29, 2020, provisional application No. 63/045,796, filed on Jun. 29, 2020.

(51) Int. Cl.
*C09G 1/02* (2006.01)
*H01L 21/321* (2006.01)

(52) U.S. Cl.
CPC .......... *C09G 1/02* (2013.01); *H01L 21/3212* (2013.01)

(58) Field of Classification Search
None
See application file for complete search history.

(56) References Cited

U.S. PATENT DOCUMENTS

| 5,154,759 A | 10/1992 | Cifuentes et al. |
| 5,876,490 A | 3/1999 | Ronay |

(Continued)

FOREIGN PATENT DOCUMENTS

| CN | 101404978 A | 4/2009 |
| CN | 102585704 A | 7/2012 |

(Continued)

OTHER PUBLICATIONS

PCT International Search Report; PCT/US2021/034054; Oct. 12, 2021.

(Continued)

*Primary Examiner* — Shamim Ahmed
(74) *Attorney, Agent, or Firm* — Lina Yang

(57) ABSTRACT

Shallow Trench Isolation (STI) chemical mechanical planarization (CMP) polishing compositions, methods and systems of use therefore are provided. The CMP polishing composition comprises abrasives of ceria coated inorganic oxide particles, such as ceria-coated silica; and dual chemical additives for providing the tunable oxide film removal rates and tunable SiN film removal rates; low oxide trench dishing, and high oxide: SiN selectivity. Dual chemical additives comprise at least one silicone-containing compound comprising at least one of (1) ethylene oxide and propylene oxide (EO-PO) group, and at least one of substituted ethylene diamine group on the same molecule; and (2)

(Continued)

at least one non-ionic organic molecule having at least two, preferably at least four hydroxyl functional groups.

20 Claims, 8 Drawing Sheets

(56) References Cited

U.S. PATENT DOCUMENTS

| | | | |
|---|---|---|---|
| 6,544,892 | B2 | 4/2003 | Srinivasan et al. |
| 6,616,514 | B1 | 9/2003 | Edelbach et al. |
| 6,914,001 | B2 | 7/2005 | Lee et al. |
| 6,964,923 | B1 | 11/2005 | Ronay |
| 6,984,588 | B2 | 1/2006 | Grover et al. |
| 7,247,082 | B2 | 7/2007 | Yoshida et al. |
| 8,778,203 | B2 | 7/2014 | Dandu et al. |
| 2002/0039875 | A1 | 4/2002 | Kobayashi et al. |
| 2006/0076317 | A1* | 4/2006 | De Rege Thesauro ............... H01L 21/3212 438/692 |
| 2006/0096496 | A1 | 5/2006 | Sun et al. |
| 2011/0124195 | A1 | 5/2011 | Park et al. |
| 2012/0077419 | A1 | 3/2012 | Zhang et al. |
| 2016/0237315 | A1 | 8/2016 | Stender et al. |
| 2017/0283673 | A1* | 10/2017 | Zhou ..................... H01L 21/463 |
| 2020/0002574 | A1* | 1/2020 | Shi ........................... C09G 1/02 |
| 2020/0003574 | A1 | 1/2020 | Shi et al. |

FOREIGN PATENT DOCUMENTS

| | | |
|---|---|---|
| CN | 104284960 A | 1/2015 |
| CN | 109906257 A | 6/2019 |
| CN | 110655868 A | 1/2020 |
| CN | 110655869 A | 1/2020 |
| CN | 110655870 A | 1/2020 |
| CN | 110819238 A | 3/2020 |
| CN | 111117492 A | 5/2020 |
| EP | 0141585 A2 | 5/1985 |
| EP | 0145150 A2 | 6/1985 |
| EP | 3476910 A1 * | 5/2019 .......... B24B 37/044 |
| EP | 3647384 A1 | 5/2020 |

OTHER PUBLICATIONS

Supplementary European Search Report; The Hague; Application No. EP21814025; Jul. 10, 2024.
IPOS Intellectual Property Office of Singapore, Search Report, Application No. 11202260477U, Jan. 29, 2024.
The China National Intellectual Property Administration; Patent Search Report; Application No. 2021800386486; Apr. 25, 2024.

* cited by examiner

LOW DISHING OXIDE CMP POLISHING COMPOSITIONS FOR SHALLOW TRENCH ISOLATION APPLICATIONS AND METHODS OF MAKING THEREOF

CROSS REFERENCE TO RELATED PATENT APPLICATIONS

The application claims the benefit of U.S. Application No. 63/032,233 filed on May 29, 2020; and U.S. Application No. 63/045,796 filed on Jun. 29, 2020. The disclosures of the applications are hereby incorporated by reference.

BACKGROUND OF THE INVENTION

This invention relates to the CMP chemical polishing compositions and chemical mechanical planarization (CMP) for Shallow Trench Isolation (STI) process.

In the fabrication of microelectronics devices, an important step involved is polishing, especially surfaces for chemical-mechanical polishing for recovering a selected material and/or planarizing the substrate structure.

For example, a SiN layer is deposited under a $SiO_2$ layer to serve as a polishing stop layer. The role of such polish stop is particularly important in Shallow Trench Isolation (STI) structures. Selectivity is characteristically expressed as the ratio of the oxide polish rate to the nitride polish rate. An example is the tunable polishing selectivity rate of silicon dioxide ($SiO_2$) or HDP films as compared to silicon nitride (SiN).

In the global planarization of patterned STI structures, tuning SiN film removal rates and tuning oxide trench dishing are two key factors to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is also important to reduce trench oxide loss by reducing oxide trench dishing in STI CMP polishing compositions.

U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876, 490. Ceria, alumina, silica & zirconia are used as abrasives. Molecular weight for such listed polyelectrolyte is from 300 to 20,000, but in overall, <100,000.

U.S. Pat. No. 6,616,514 discloses a chemical mechanical polishing slurry for use in removing a first substance from a surface of an article in preference to silicon nitride by chemical mechanical polishing. The chemical mechanical polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium.

U.S. Pat. No. 6,984,588 discloses a chemical mechanical polishing composition comprising a soluble cerium compound at a pH above 3 and a method to selectively polish a silicon oxide overfill in preference to a silicon nitride film layer in a single step during the manufacture of integrated circuits and semiconductors.

U.S. Pat. No. 6,544,892 discloses a method of removing silicon dioxide in preference to silicon nitride from a surface of an article by chemical-mechanical polishing comprising polishing said surface using a polishing pad, water, abrasive particles, and an organic compound having both a carboxylic acid functional group and a second functional group selected from amines and halides.

U.S. Pat. No. 7,247,082 discloses a polishing composition comprising an abrasive, a pH adjusting agent, an improver of a selective ratio, and water, wherein the abrasive is contained in an amount of from 0.5 to 30% by weight, the pH adjusting agent is contained in an amount of from 0.01 to 3% by weight, the improver of a selective ratio is contained in an amount of 0.3 to 30% by weight, and water is contained in an amount of 45 to 99.49% by weight, wherein the weight % is based on the weight of the polishing composition, and wherein the improver is one or more compounds selected from the group consisting of methylamine, ethylamine, propylamine, isopropyl amine, dimethylamine, diethylamine, dipropylamine, diisopropylamine, ethylenediamine, 1,2-diaminopropane, 1,3-propanediamine, 1,4-butanediamine, hexamethylenediamine, N,N,N',N'-tetramethyl-1,6-diaminohexane, 6-(dimethylamino)-1-hexanol, bis(3-aminopropyl)amine, triethylenetetraamine, diethylene glycol bis(3-aminopropyl) ether, piperazine, and piperidine.

U.S. Pat. No. 8,778,203 discloses a method for selectively removing a target material on a surface of a substrate, the method comprising the steps of: providing a substrate comprising a target material and a non-target material; dissolving oxygen in a polishing solution to achieve a pre-determined dissolved oxygen concentration, the polishing solution having a pH of from about 5 to about 11, wherein the polishing solution comprises a plurality of abrasive silica particles, at least some of said plurality of abrasive silica particles are functionalized with n-(trimethoxysilylpropyl) isothiouronium chloride; maintaining, by continuously applying substantially pure oxygen to said polishing solution, the predetermined dissolved oxygen concentration of said polishing solution at or between approximately 8.6 mg/L and approximately 16.6 mg/L; disposing the polishing solution between a polishing pad and the surface; applying the polishing pad to the surface; and selectively removing a predetermined thickness of the target material; wherein varying the dissolved oxygen content of the polishing solution varies the removal ratio of target material to non-target material during the removal step.

U.S. Pat. No. 6,914,001 discloses s chemical mechanical polishing method comprising: contacting a surface of a semiconductor wafer with a surface of a polishing pad; supplying an aqueous solution containing abrasive particles, a removal rate accelerator, and different first and second passivation agents to an interface between the surface of the polishing pad and the surface of the semiconductor wafer, wherein the first passivation agent is an anionic, cationic or nonionic surfactant; and, rotating the surface of the semiconductor wafer relative to the surface of the polishing pad to remove an oxide material on the semiconductor wafer.

However, those prior disclosed Shallow Trench Isolation (STI) polishing compositions did not address the importance of oxide film removal rate tuning, SiN film removal rate tuning and oxide trench dishing reducing and more uniform oxide trench dishing on the polished patterned wafers along with the tunable oxide vs nitride selectivity.

Therefore, it should be readily apparent from the foregoing that there remains a need within the art for compositions, methods and systems of STI chemical mechanical polishing that can afford the tunable oxide film and HDP film removal rates, the tunable SiN film removal rates and the reduced oxide trench dishing and more uniformed oxide trench dishing across various sized oxide trench features on polishing patterned wafers in a STI chemical and mechanical polishing (CMP) process.

SUMMARY OF THE INVENTION

The present invention provides STI CMP polishing compositions for the tunable oxide film and HDP film removal rates with the use of relative low concentrations of ceria-coated inorganic oxide abrasives, the tunable SiN film removal rates and the tunable TEOS: SiN selectivity and the reduced oxide trench dishing on the polished patterned wafers.

The present invented STI CMP polishing compositions provides tunable oxide or HDP film vs nitride film selectivity by introducing dual types of chemical additives for tuning oxide and SiN film removal rates and reducing oxide trenching dishing in the chemical mechanical polishing (CMP) compositions for Shallow Trench Isolation (STI) CMP applications at wide pH range including acidic, neutral and alkaline pH conditions.

The disclosed chemical mechanical polishing (CMP) compositions for Shallow Trench Isolation (STI) CMP applications have a unique combination of using ceria-coated inorganic oxide abrasive particles and the suitable dual types of chemical additives as oxide film and nitride film removal rate tuning agents, and oxide trench dishing reducing agents.

One of the additives is a silicone-containing compound comprising at least one of (1) ethylene oxide and propylene oxide (EO-PO) group, and at least one of substituted ethylene diamine group on the same molecule.

The other additive is an non-ionic organic molecule having at least two hydroxyl functional groups.

In one aspect, there is provided a chemical mechanical polishing composition comprising:
  at least one ceria-coated inorganic oxide particles;
  at least one silicone-containing compound comprising at least one selected from the group consisting of at least one ethylene oxide and propylene oxide (EO-PO) group, and at least one substituted ethylene diamine group;
  at least one non-ionic organic molecule having at least two hydroxyl functional group;
  solvent; optionally
  a biocide; and
  a pH adjuster;
  wherein the composition has a pH of from 2 to 12, 3 to 10, 4 to 9, or 5 to 7.

In another aspect, there is provided a method of chemical mechanical polishing (CMP) a semiconductor substrate having at least one surface comprising a silicon oxide film, the method comprising the steps of:
  providing the semiconductor substrate;
  providing a polishing pad;
  providing the chemical mechanical polishing (CMP) composition comprising:
    at least one ceria-coated inorganic oxide particles;
    at least one silicone-containing compound comprising at least one selected from the group consisting of at least one ethylene oxide and propylene oxide (EO-PO) group, and at least one substituted ethylene diamine group;
    at least one non-ionic organic molecule having at least two hydroxyl functional group;
    solvent; optionally
    a biocide; and
    a pH adjuster;
    wherein the composition has a pH of from 2 to 12, 3 to 10, 4 to 9, or 5 to 7;
  contacting the surface of the semiconductor substrate with the polishing pad and the chemical mechanical polishing composition; and
  polishing the least one surface comprising silicon dioxide.

In yet another aspect, there is provided a system of chemical mechanical polishing (CMP) a semiconductor substrate having at least one surface comprising silicon oxide, the system comprising:
  a semiconductor substrate;
  the chemical mechanical polishing (CMP) composition comprising:
    at least one ceria-coated inorganic oxide particles;
    at least one silicone-containing compound comprising at least one selected from the group consisting of at least one ethylene oxide and propylene oxide (EO-PO) group, and at least one substituted ethylene diamine group;
    at least one non-ionic organic molecule having at least two hydroxyl functional group;
    solvent; optionally
    a biocide; and
    a pH adjuster;
    wherein the composition has a pH of from 2 to 12, 3 to 10, 4 to 9, or 5 to 7;
  and
  a polishing pad;
  wherein the at least one surface comprising silicon oxide film is in contact with the polishing pad and the chemical mechanical polishing composition.

In one embodiment, the at least one silicone-containing compound having a general molecule structure (1):

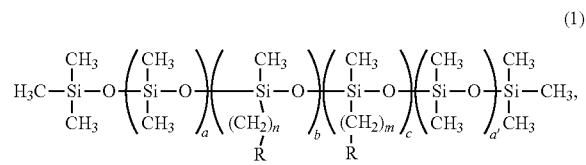

wherein
a and a' each is independently ranged from 0 to 50, 0 to 40, 0 to 30, 0 to 20, 0 to 10, or 0 to 5; wherein at least one of a and a' is not 0;
b and c each is independently ranged from 0 to 50, 0 to 40, 0 to 30, 0 to 20, 0 to 10, or 0 to 5; wherein at least one of b and c is not 0;
n and m can be the same or different, and each is independently ranged from 1 to 12, 1 to 8, 1 to 5, or 2 to 4;
R' and R' groups on the site chains of the molecule can be the same or different, and each is independently selected from the group comprising of: hydrogen; —$(CH_2)_p CH_3$ alkyl group with p ranged from 1 to 12 or 2 to 5; —$NH_2$; —$NH(CH_2)_q$—$NH_2$ group with q ranged from 1 to 12 or 2 to 5; ethylene oxide (EO) and propylene oxide (PO) repeating group -$(EO)_e$—$(PO)_d$ —OH with d and e each independently ranges from 1 to 50, 1 to 40, 1 to 30, 1 to 20, 1 to 10, or 1 to 5; —COOH, —COOM, —COOR$^1$, —R$^1$COOH, —R$^1$COOM, —R$^1$COOR$^2$, —SO$_3$H; —R$^1$SO$_3$H; —SO$_3$M; phosphonic acid; phosphate salt selected from sodium, potassium or ammonium salts; aromatic group selected from benzyl, di-benzyl, or other aromatic moieties; fluorine-containing organic group —(CF$_2$)$_s$CF$_3$ with s ranged from 1 to 12 or 2 to 5; wherein R$^1$ and R$^2$ each is independently —(CH$_2$)$_m$ with m ranged from 1 to 12, or —(C$_6$H$_4$)$_n$— with n ranged from 1 to 4; M is selected from sodium, potassium or ammonium.

Examples of the at least one silicone-containing compound having a general molecule structure (1) include but are not limited to

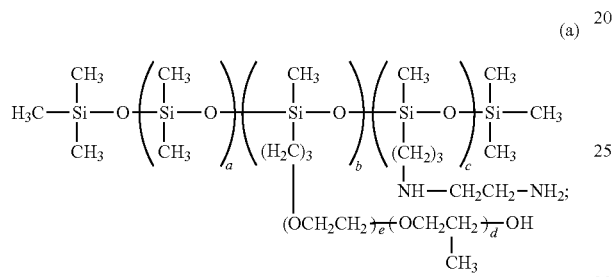

(a)

wherein a is selected from 0 to 50, 0 to 40, 0 to 30, 0 to 20, 0 to 10, or 0 to 5;

b and c can be the same or different, and each is independently selected from f 0 to 50, 0 to 40, 0 to 30, 0 to 20, 0 to 10, or 0 to 5; wherein at least one of b and c is not 0;

and e and d can be the same or different, and each is independently ranged from 1 to 12;

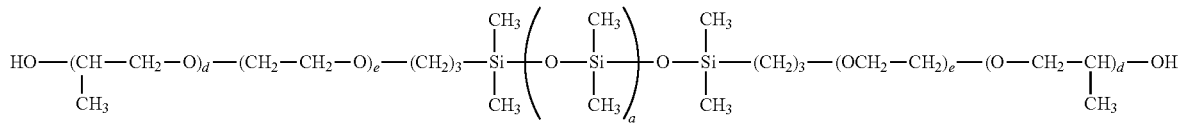

(b)

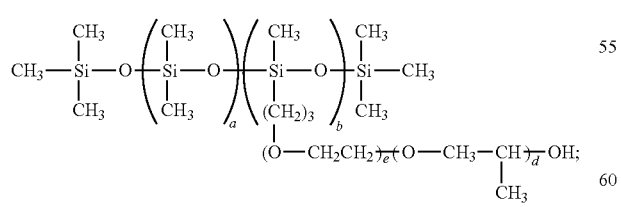

wherein a is selected from 0 to 50, 0 to 40, 0 to 30, 0 to 20, 0 to 10, and 0 to 5;

b is selected from 1 to 50, 1 to 40, 1 to 30, 1 to 20, 1 to 10, or 1 to 5;

and e and d can be the same or different, and each is independently ranged from 1 to 12;

and

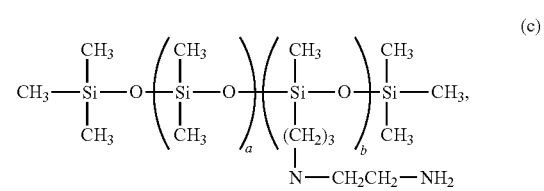

(c)

wherein a is selected from 0 to 50, 0 to 40, 0 to 30, 0 to 20, 0 to 10, or 0 to 5;

b is selected from 1 to 50, 1 to 40, 1 to 30, 1 to 20, 1 to 10, or 1 to 5.

In another embodiment, the at least one silicone-containing compound having a general molecule structure (2):

wherein a is selected from 0 to 50, 0 to 40, 0 to 30, 0 to 20, 0 to 10, or 0 to 5;

e and d can be the same or different, and each is independently ranged from 1 to 12.

In another embodiment, the at least one silicone-containing compound having a general molecule structure (3):

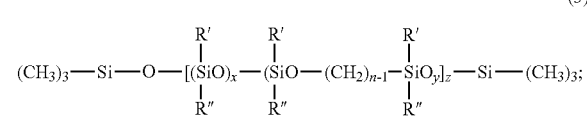

(3)

wherein

R' and R' can be the same or different, and each is independently selected from the group consisting of hydrogen; —(CH$_2$)$_p$CH$_3$ with p ranged from 1 to 12 or 2 to 5; —NH$_2$; —NH(CH$_2$)$_q$—NH$_2$ with q ranged from 1 to 12 or from 2 to 5; ethylene oxide (EO) and propylene oxide (PO) repeating group -(EO)$_e$—(PO)$_a$—OH with d and e each independently selected from the group consisting of from 1 to 50, 1 to 40, 1 to 30, 1 to 20, 1 to 10, and 1 to 5; —COOH; —COOM; —COOR$^1$; —R$^1$COOH; —R$^1$COOM; —R$^1$COOR$^2$; —SO$_3$H; —SO$_3$M; —R$^1$SO$_3$H; phosphonic acid; phosphate salt selected from sodium, potassium or ammonium salts; benzyl; di-benzyl; wherein $R^1$ and $R^2$ each is independently selected from the group consisting of —$(CH_2)_m$ with m ranged from 1 to 12, and —$(C_6H_4)_n$, with n ranged from 1 to 4; and M is selected from the group consisting of sodium, potassium, and ammonium; and x, y, and z can be the same or different, and each is independently selected from 1 to 12; n–1 is from 2 to 13.

The solvent includes but is not limited to deionized (DI) water, distilled water, and alcoholic organic solvents.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one or 2-methyl-4-isothiazolin-3-one.

Suitable pH-adjusting agents to lower the pH of the polishing composition include, but are not limited to, nitric acid, sulfuric acid, tartaric acid, succinic acid, citric acid, malic acid, malonic acid, various fatty acids, hydrochloric acid, phosphoric acid various polycarboxylic acids and mixtures thereof. Suitable pH-adjusting agents to raise the pH of the polishing composition include, but are not limited to, potassium hydroxide, sodium hydroxide, ammonia hydroxide, tetraethylammonium hydroxide, organic quaternary ammonium hydroxide compounds; ethylenediamine, piperazine, polyethyleneimine, modified polyethyleneimine, and other chemical reagents that can be used to adjust pH towards the more alkaline direction.

The polished silicon oxide films (in short oxide films) can be chemical vapor deposition (CVD), Plasma Enhance CVD (PECVD), High Density Deposition CVD (HDP), or spin on oxide films.

The substrate disclosed above can further comprises a silicon nitride surface. The removal selectivity of $SiO_2$: SiN is tunable depending on the relevant STI CMP application requirements.

DETAILED DESCRIPTION OF THE INVENTION

Figure 1:
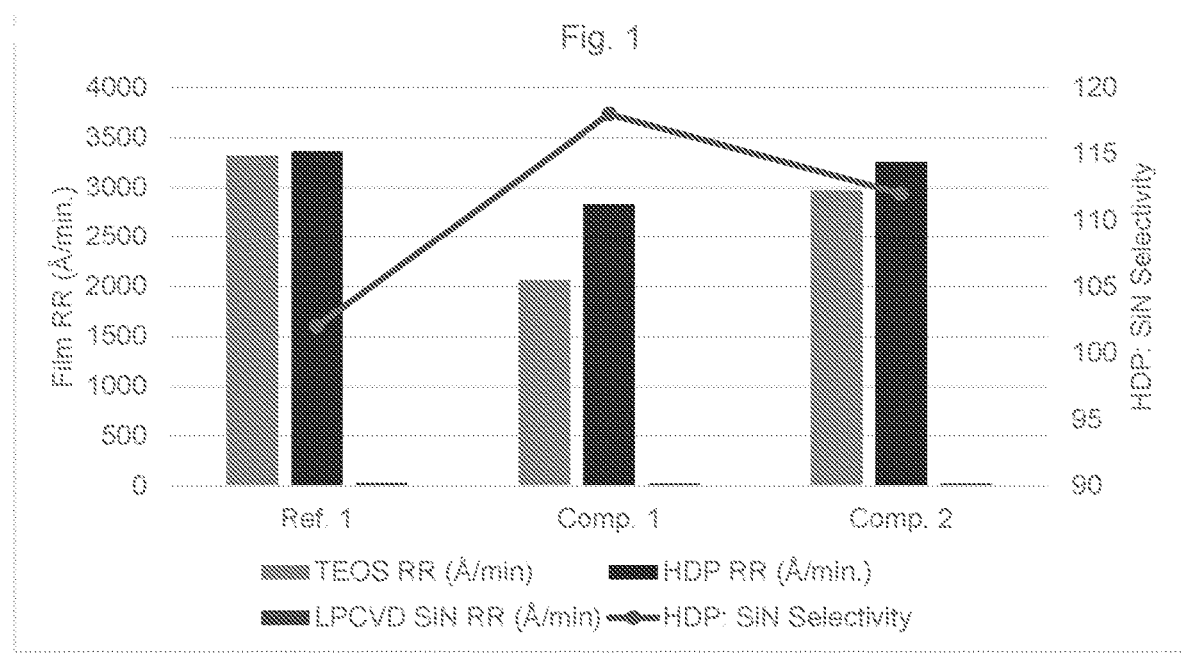
FIG. 1. displays Removal rate (Å/min.) and Removal rate Selectivity for HDP and SiN Films and HDP: SiN using Ref. 1, Comp. 1 and Comp. 2

In the global planarization of patterned STI structures, tuning SiN removal rates, reducing oxide trench dishing across various sized oxide trench features, tuning oxide film removal rates, and using relative low concentrations of ceria-coated inorganic oxide particles as abrasives are the key factors to be considered.

The lower trench oxide loss will prevent electrical current leaking between adjacent transistors. Non-uniform trench oxide loss across die (within die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. The use of the term "comprising" in the specification and the claims includes the narrower language of "consisting essentially of" and "consisting of."

Embodiments are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.00001 weight percent, based on the total weight of the composition in which such components are employed.

This development relates to Chemical Mechanical Polishing (CMP) compositions using chemical additives and ceria-coated composite particles as abrasives for Shallow Trench Isolation (STI) CMP applications.

More specifically, the disclosed chemical mechanical polishing (CMP) composition for Shallow Trench Isolation (STI) CMP applications have a unique combination of using ceria-coated inorganic oxide abrasive particles and two types of chemical additives as dual chemical additives for oxide film removal rate tuning, oxide trench dishing reducing and nitride removal rate tuning.

Dual chemical additives used in the same STI CMP polishing compositions provide the benefits of achieving desirable oxide film removal rates, tunable SiN film removal rates, and high tunable Oxide: SiN selectivity, reduced erosion, SiN loss, reduced total defect accounts, and more importantly, providing significantly reduced oxide trench dishing and improving over polishing window stability on polishing patterned wafers.

In one aspect, there is provided a chemical mechanical polishing composition comprising:

at least one ceria-coated inorganic oxide particles;

at least one silicone-containing compound comprising at least one selected from the group consisting of at least one ethylene oxide and propylene oxide (EO-PO) group, and at least one substituted ethylene diamine group;

at least one non-ionic organic molecule having at least two hydroxyl functional group;

solvent; optionally a biocide; and a pH adjuster;

wherein the composition has a pH of from 2 to 12, 3 to 10, 4 to 9, or 5 to 7.

Ceria-coated inorganic oxide particles are the composite particles having inorganic oxide particles as the core particles with their surfaces coated with ceria particles.

The mean particle size (MPS measured by light scattering) of ceria-coated inorganic metal oxide particles ranges from 10 nm to 1,000 nm, 15 nm to 800 nm, the preferred mean particle sized are ranged from 20 nm to 500 nm, the more preferred mean particle sizes are ranged from 50 nm to 250 nm. The ceria particles are smaller than the core particles. The ceria particles range from 5 to 40 nm.

The ceria-coated inorganic oxide particles include, but are not limited to, ceria-coated colloidal silica, ceria-coated alumina, ceria-coated titania, ceria-coated zirconia, or any other ceria-coated inorganic metal oxide particles.

The preferred ceria-coated inorganic oxide particles are ceria-coated colloidal silica particles. The ceria-coated colloidal silica particles are having silica particles as core particles with their surfaces coated with ceria particles.

In some embodiments, the concentrations of these ceria-coated inorganic oxide particles range from 0.01 wt. % to 20 wt. %, 0.05 wt. % to 10 wt. %, or from 0.1 wt. % to 5 wt. %.

In some other embodiments, the concentrations of these ceria-coated inorganic oxide particles range from 0.01 wt. % to 2 wt. %, 0.025 wt. % to 1.0 wt. %, or from 0.05 wt. % to 0.5 wt. %.

The first chemical additive comprises the silicone-containing compound.

In one embodiment, the at least one silicone-containing compound having a general molecule structure (1):

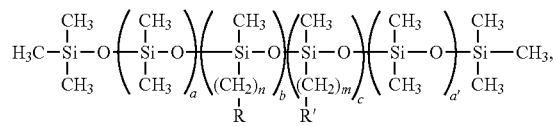

(1)

wherein a and a' each is independently ranged from 0 to 50, 0 to 40, 0 to 30, 0 to 20, 0 to 10, or 0 to 5; wherein at least one of a and a' is not 0;

b and c each is independently ranged from 0 to 50, 0 to 40, 0 to 30, 0 to 20, 0 to 10, or 0 to 5; wherein at least one of b and c is not 0;

n and m can be the same or different, and each is independently ranged from 1 to 12, 1 to 8, 1 to 5, or 2 to 4;

R and R' can be the same or different, and each is independently selected from the group consisting of hydrogen; —$(CH_2)_p CH_3$ with p ranged from 1 to 12 or 2 to 5; —$NH_2$; —$NH(CH_2)_q$—$NH_2$ with q ranged from 1 to 12 or from 2 to 5; ethylene oxide (EO) and propylene oxide (PO) repeating group; -$(EO)_e$—$(PO)_d$—OH with d and e each independently selected from the group consisting of from 1 to 50, 1 to 40, 1 to 30, 1 to 20, 1 to 10, and 1 to 5; —COOH; —COOM; —COOR$^1$; —R$^1$COOH; —R$^1$COOM; —R$^1$COOR$^2$; —$SO_3H$; —$SO_3M$; —R$^1SO_3H$; phosphonic acid; phosphate salt selected from sodium, potassium or ammonium salts; benzyl; di-benzyl; wherein R$^1$ and R$^2$ each is independently selected from the group consisting of —$(CH_2)_m$ with m ranged from 1 to 12, and —$(C_8H_4)_n$ with n ranged from 1 to 4; and M is selected from the group consisting of sodium, potassium, and ammonium.

Examples of the at least one silicone-containing compound having a general molecule structure (1) include but are not limited to

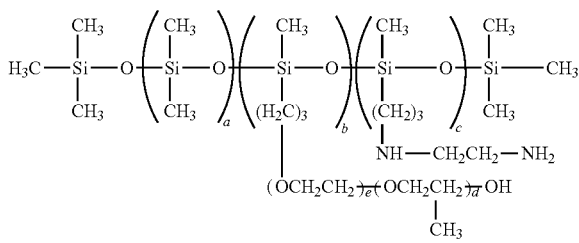

(a)

wherein a is selected from 0 to 50, 0 to 40, 0 to 30, 0 to 20, 0 to 10, or 0 to 5;

b and c can be the same or different, and each is independently selected from f 0 to 50, 0 to 40, 0 to 30, 0 to 20, 0 to 10, or 0 to 5; wherein at least one of b and c is not 0;

and e and d can be the same or different, and each is independently ranged from 1 to 12;

(b)

$$CH_3-Si(CH_3)_2-O-\left(Si(CH_3)_2-O\right)_a-\left(Si(CH_3)(CH_2)_3-O\right)_b-Si(CH_3)_2-CH_3$$
$$(O-CH_2CH_2)_e-(O-CH_2-CH(CH_3))_d-OH$$

wherein
a is selected from 0 to 50, 0 to 40, 0 to 30, 0 to 20, 0 to 10, and 0 to 5;
b is selected from 1 to 50, 1 to 40, 1 to 30, 1 to 20, 1 to 10, or 1 to 5;
and
e and d can be the same or different, and each is independently ranged from 1 to 12;
and (c)

$$CH_3-Si(CH_3)_2-O-\left(Si(CH_3)_2-O\right)_a-\left(Si(CH_3)(CH_2)_3-O\right)_b-Si(CH_3)_2-CH_3$$
$$N-CH_2CH_2-NH_2$$

wherein
a is selected from 0 to 50, 0 to 40, 0 to 30, 0 to 20, 0 to 10, or 0 to 5;
b is selected from 1 to 50, 1 to 40, 1 to 30, 1 to 20, 1 to 10, or 1 to 5.

In another embodiment, the at least one silicone-containing compound having a general molecule structure (2):

$$HO-(CH(CH_3)-CH_2-O)_d-(CH_2-CH_2-O)_e-(CH_2)_3-Si(CH_3)_2-(O-Si(CH_3)_2)_a-O-Si(CH_3)_2-(CH_2)_3-(OCH_2-CH_2)_e-(O-CH_2-CH(CH_3))_d-OH$$

wherein
a is selected from 0 to 50, 0 to 40, 0 to 30, 0 to 20, 0 to 10, or 0 to 5;
e and d can be the same or different, and each is independently ranged from 1 to 12.

Yet, in another embodiment, the at least one silicone-containing compound having a general molecule structure (3):

(3)

$$(CH_3)_3-Si-O-[(SiO)_x(R')(R'')-(SiO-(CH_2)_{n-1})(R')(R'')-(SiO)_y(R')(R'')]_z-Si-(CH_3)_3;$$

wherein
R' and R'' can be the same or different, and each is independently selected from the group consisting of hydrogen; —(CH$_2$)$_p$CH$_3$ with p ranged from 1 to 12 or 2 to 5; —NH$_2$; —NH(CH$_2$)$_q$—NH$_2$ with q ranged from 1 to 12 or from 2 to 5; ethylene oxide (EO) and propylene oxide (PO) repeating group -(EO)$_e$—(PO)$_d$—OH with d and e each independently selected from the group consisting of from 1 to 50, 1 to 40, 1 to 30, 1 to 20, 1 to 10, and 1 to 5; —COOH; —COOM; —COOR$^1$; —R$^1$COOH; —R$^1$COOM; —R$^1$COOR$^2$; —SO$_3$H; —SO$_3$M; —R$^1$SO$_3$H; phosphonic acid; phosphate salt selected from sodium, potassium or ammonium salts; benzyl; di-benzyl; wherein R$^1$ and R$^2$ each is independently selected from the group consisting of —(CH$_2$) m with m ranged from 1 to 12, and —(C$_6$H$_4$), with n ranged from 1 to 4; and M is selected from the group consisting of sodium, potassium, and ammonium; and x, y, and z can be the same or different, and each is independently selected from 1 to 12; n–1 is from 2 to 13.

The STI CMP composition contains 0.0001 wt. % to 2.0% wt. %, 0.001 wt. % to 1.0 wt. %, or 0.0025 wt. % to 0.25 wt. % of at least one silicone-containing surface wetting compound comprising at least one selected from the group consisting of at least one ethylene oxide and propylene oxide (EO-PO) group, and at least one substituted ethylene diamine group on the same molecule as a chemical additive that functions primarily to tune oxide film removal rates and SiN film removal rates and to reduce oxide trenching dishing.

The second chemical additive comprises at least one non-ionic organic molecule having at least two hydroxyl functional group.

In one embodiment, the second chemical additive has a general structure shown below:

(a)

$$R_3OH_2C-[CH(OR_2)]_n-CH_2OR_1.$$

In the general molecular structure (a), n is selected from 2 to 5,000, 3 to 12, or 4 to 6.

In these general molecular structures; R$_1$, R$_2$, and R$_3$ groups can be the same or different atoms or functional groups.

R$_1$, R$_2$, and R$_3$ can be independently selected from the group consisting of hydrogen, an alkyl group C$_n$H$_{2n+1}$, n is from 1 to 12, preferably 1 to 6, and more preferably 1 to 3; alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two of R$_1$, R$_2$, and R$_3$ are hydrogen atoms.

In another embodiment, the chemical additive has a general structure shown below:

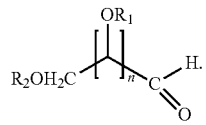

(b)

In this structure, one —CHO functional group is located at one end of the molecule as the terminal functional group; n is selected from 2 to 5,000, 3 to 12, or 4 to 7.

Each of $R_1$ and $R_2$ can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof.

In yet another embodiment, the second chemical additives has a molecular structure selected from the group comprising of (c), (d), or (e);

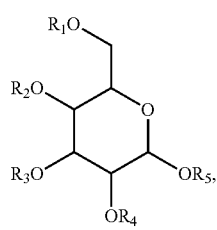

(c)

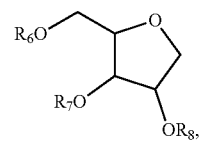

(d)

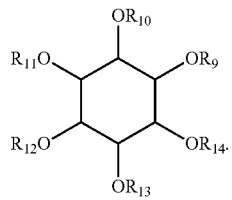

(e)

In these general molecular structures; $R_1$, $R_2$, $R_3$, $R_4$, $R_5$, $R_6$, $R_7$, $R_8$, $R_9$, $R_{10}$, $R_{11}$, $R_{12}$, $R_{13}$, and $R_{14}$ can be the same or different atoms or functional groups.

They can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four or more of them are hydrogen atoms.

Yet, in another embodiment, the chemical additives contain at least one six-member ring structure motif ether bonded with at least one polyol molecular unit containing multiple hydroxyl functional groups in the molecular unit structures or at least one polyol molecular unit containing multiple hydroxyl functional groups in the molecular unit structures and at least one six-member ring polyol. A polyol is an organic compound containing hydroxyl groups.

The general molecular structure for the chemical additives is shown in (f):

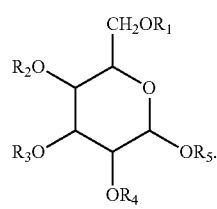

(f)

In structure (f), at least one R in the group of $R_1$ to $R_5$ in the general molecular structure (f) is a polyol molecular unit having a structure shown in (i):

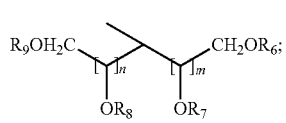

(i)

wherein n and m can be the same or different and each of them is independently selected from 1 to 5, preferably from 1 to 4, more preferably from 1 to 3, and most preferably from 1 to 2; $R_6$ to $R_9$ can be the same or different atoms or functional groups; each of $R_6$, $R_7$, $R_8$, and $R_9$ is independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof; and at least two of them are hydrogen atoms; and the rest of each R in the group of $R_1$ to $R_5$ can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, a six-member ring polyol having a structure shown in (ii):

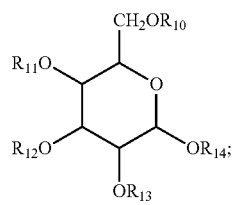

(ii)

wherein the structure (ii) is connected through oxygen carbon bond to structure (f) by removing one R from $R_{11}$ to $R_{14}$ in (ii) and each of the rest $R_{10}$ to $R_{14}$ is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof; and combinations thereof.

In some embodiments, the general molecular structure (f) has at least two, at least four, or at least six of the Rs in the group of $R_1$ to $R_9$ are hydrogen atoms. Thus, the chemical additives contain at least two, at least four, or at least six hydroxyl functional groups in their molecular structures.

The second chemical additive can be selected from the group consisting of (a), (b), (c), (d), (e), (f), and combinations thereof.

Examples of the second chemical additives comprise maltitol, lactitol, maltotritol, ribitol, D-sorbitol, mannitol, dulcitol, iditol, D-(−)-Fructose, sorbitan, sucrose, ribose, Inositol, glucose, D-arabinose, L-arabinose, D-mannose, L-mannose, meso-erythritol, beta-lactose, arabinose, and combinations thereof. The preferred chemical additives are maltitol, lactitol, maltotritol, D-sorbitol, mannitol, dulcitol, iditol, D-(−)-Fructose, sucrose, ribose, Inositol, glucose. D-(+)-mannose, beta-lactose, and combinations thereof. The more preferred chemical additives are maltitol, lactitol, maltotritol, D-sorbitol, mannitol, dulcitol, D-(−)-Fructose, beta-lactose, and combinations thereof.

Some examples of the second chemical additives are listed below:

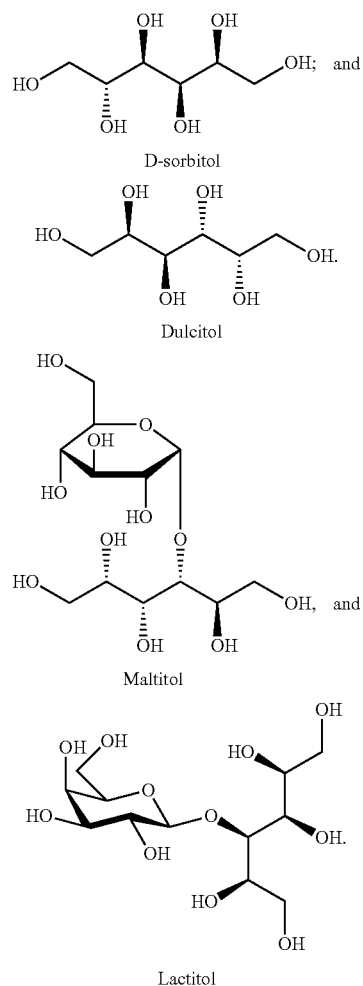

The preferred second type chemical additives are D-sorbitol, Dulcitol, Maltitol, and Lactitol.

The STI CMP composition also contains from 0.001 wt. % to 2.0% wt. %, 0.0025 wt. % to 1.0 wt. %, or 0.05 wt. % to 0.5 wt. % of at least one non-ionic organic molecule having at least two hydroxyl functional group that functions primarily as an SiN film removal rate and oxide film removal rate tuning agent and oxide trenching dishing reducers.

The solvent includes but is not limited to deionized (DI) water, distilled water, and alcoholic organic solvents.

The preferred solvent is DI water.

The STI CMP composition may contain a biocide from 0.0001 wt. % to 0.05 wt. %; preferably from 0.0005 wt. % to 0.025 wt. %, and more preferably from 0.001 wt. % to 0.01 wt. %.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one or 2-methyl-4-isothiazolin-3-one.

The STI CMP composition may contain a pH adjusting agent.

An acidic or basic pH adjusting agent can be used to adjust the STI polishing compositions to the optimized pH value.

Suitable pH-adjusting agents to lower the pH of the polishing composition include, but are not limited to, nitric acid, sulfuric acid, tartaric acid, succinic acid, citric acid, malic acid, malonic acid, various fatty acids, hydrochloric acid, phosphoric acid various polycarboxylic acids and mixtures thereof. Suitable pH-adjusting agents to raise the pH of the polishing composition include, but are not limited to, potassium hydroxide, sodium hydroxide, ammonia hydroxide, tetraethylammonium hydroxide, organic quaternary ammonium hydroxide compounds; ethylenediamine, piperazine, polyethyleneimine, modified polyethyleneimine, and other chemical reagents that can be used to adjust pH towards the more alkaline direction.

The pH of the compositions is in the range of 2 to 12, 3 to 10, 4 to 9, or 5 to 7;

The STI CMP composition contains 0 wt. % to 1 wt. %, 0.01 wt. % to 0.5 wt. %, or 0.1 wt. % to 0.25 wt. % pH adjusting agent.

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In yet another aspect, there is provided a system of chemical mechanical polishing (CMP) a substrate having at least one surface comprising silicon dioxide using the chemical mechanical polishing (CMP) composition described above in Shallow Trench Isolation (STI) process.

The polished oxide films can be Chemical Vapor Deposition (CVD), Plasma Enhance CVD (PECVD), High Density Deposition CVD (HDP), or spin on oxide films.

The substrate disclosed above can further comprises a silicon nitride surface. The removal selectivity of $SiO_2$:SiN is tunable depending on the STI CMP application requirements.

The following non-limiting examples are presented to further illustrate the present invention.

EXAMPLES

CMP Methodology

In the examples presented below, CMP experiments were run using the procedures and experimental conditions given below.

Glossary/Components

Ceria-coated silica particles (with varied sizes) were supplied by JGCC Inc. in Japan. The ceria-coated silica particles have a mean particle size (MPS) ranged from approximately 20 nanometers (nm) to 500 nanometers (nm). The MPS is measured by light scattering. The ceria particles coated on the surface of the core silica particles have smaller size. For example, the ceria particles size is >13 nm for ceria-coated silica particles having a mean particle size of approximately 120 nanometers (nm).

The silicone-containing compound used were silicone amines Silamine® series and silicone polyethers Silsurf® series from Siltech Corporation, 225 Wicksteed Avenue, Toronto, Ontario, Canada. M4H 1G5.

Silamine® series (silicone amines) include Silamine® C-100 and its derivatives, Silamine® C-50, Silamine® AS, Silamine CR-300, and the Silsurf® series (silicone polyethers) include Silsurf® A008-AC-UP, Silsurf® A208, Silsurf® CR 1115, Silsurf® E608, Silsurf® J208-6.

The non-ionic organic molecule having at least two, preferably at least four hydroxyl functional groups used were maltitol, D-Fructose, Dulcitol, D-sorbitol and other chemical raw materials were supplied by Sigma-Aldrich, St. Louis, MO, or supplied by Evonik Industries in Allentown, PA.

TEOS: tetraethyl orthosilicate

Polishing Pad: Polishing pad, IC1010 and other pads were used during CMP, supplied by DOW, Inc.

Parameters

General

Å or A: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: composition flow, ml/min
Wt. %: weight percentage (of a listed component)
TEOS: SiN Selectivity: (removal rate of TEOS)/(removal rate of SiN)
HDP: high density plasma deposited TEOS
TEOS or HDP Removal Rates: Measured TEOS or HDP removal rate at a given down pressure. The down pressure of the CMP tool was 3.1 psi in the examples listed below.
SiN Removal Rates: Measured SiN removal rate at a given down pressure. The down pressure of the CMP tool was 3.1 psi in the examples listed below.

Metrology

Films were measured with a ResMap CDE, model 168, manufactured by Creative Design Engineering, Inc, 20565 Alves Dr., Cupertino, CA, 95014. The ResMap tool is a four-point probe sheet resistance tool. Forty-nine-point diameter scan at 5 mm edge exclusion for film was taken.

CMP Tool

The CMP tool that was used is a 200 mm Mirra, or 300 mm Reflexion manufactured by Applied Materials, 3050 Boweres Avenue, Santa Clara, California, 95054. An IC1000 pad supplied by DOW, Inc, 451 Bellevue Rd., Newark, DE 19713 was used on platen 1 for blanket and pattern wafer studies.

The IC1010 pad was broken in by conditioning the pad for 18 mins. At 7 lbs. down force on the conditioner. To qualify the tool settings and the pad break-in two tungsten monitors and two TEOS monitors were polished with Versum® STI2305 composition, supplied by Versum Materials Inc. at baseline conditions.

Wafers

Polishing experiments were conducted using PECVD or LECVD or HD TEOS wafers. These blanket wafers were purchased from Silicon Valley Microelectronics, 2985 Kifer Rd., Santa Clara, CA 95051.

Polishing Experiments

In blanket wafer studies, oxide blanket wafers, and SiN blanket wafers were polished at baseline conditions. The tool baseline conditions were: table speed; 93 rpm, head speed: 87 rpm, membrane pressure; 3.1 psi DF, slurry flow rate: 200 ml/min.

The composition was used in polishing experiments on patterned wafers (MIT860), supplied by SWK Associates, Inc. 2920 Scott Blvd. Santa Clara, CA 95054). These wafers were measured on the Veeco VX300 profiler/AFM instrument. The 3 different sized pitch structures were used for oxide dishing measurement. The wafer was measured at center, middle, and edge die positions.

TEOS: SiN Selectivity: (removal rate of TEOS)/(removal rate of SiN) obtained from the STI CMP polishing compositions were tunable.

In the following working examples, a STI polishing composition comprising 0.2 wt. % ceria-coated silica, a biocide ranging from 0.0001 wt. % to 0.05 wt. %, 0.15 wt. % D-sorbitol and deionized water was prepared as reference at pH 5.35.

The polishing working compositions were prepared using 0.2 wt. % ceria-coated silica, 0.15 wt. % D-sorbitol, various wt. % of Silamine® compounds as another type of chemical additive, a biocide ranging from 0.0001 wt. % to 0.05 wt. %, and deionized water at same pH conditions.

Example 1

In Example 1, the polishing compositions used for oxide polishing were shown in Table 1.

Reference 1 (Ref. 1) was made using 0.2 wt. % ceria-coated silica, a biocide ranging from 0.0001 wt. % to 0.05 wt. %, 0.15 wt. % D-sorbitol, and deionized water. The working compositions were made by adding various wt. % of Silamine compounds into the Reference sample. The samples were at pH 5.35.

TABLE 1

Effects of dual chemical additives on
film RR (Å/min.) & HDP: SiN Selectivity

| Composition | TEOS RR (Å/min.) | HDP RR (Å/min.) | LPCVD SIN RR (Å/min) | HDP: SIN Selectivity |
|---|---|---|---|---|
| Ref. 1 (0.2% Ceria-coated Silica + 0.15% D-Sorbitol) | 3319 | 3358 | 33 | 102:1 |
| Comp. 1 (Ref. 1 + 0.01% Silamine ® AS) | 2065 | 2827 | 24 | 118:1 |
| Comp. 2 (Ref. 1 + 0.0075% Silamine ® C-100) | 2967 | 3251 | 29 | 112:1 |

The removal rates (RR at Å/min) for different films were tested. Results were listed in Table 1 and depicted in FIG. 1. As the results shown in Table 1 and FIG. 1, the addition of Silamine® into the polishing composition effectively suppressed LPCVD SiN film removal rates and increased HDP: SiN polishing selectivity.

With the addition of 0.01 wt. % Silamine® AS, the HDP: SiN polishing selectivity was increased from 102:1 to 118:1.

With the addition of 0.0075 wt. % Silamine® C-100, the HDP: SiN polishing selectivity was increased from 102:1 to 112:1.

Example 2

In Example 2, the same polishing compositions used in Example 1 were used for oxide patterned wafer polishing and 100 µm and 200 µm oxide trench dishing vs over polishing times. The results were shown in Table 2 and depicted in FIGS. 2 and 3.

Figure 2:
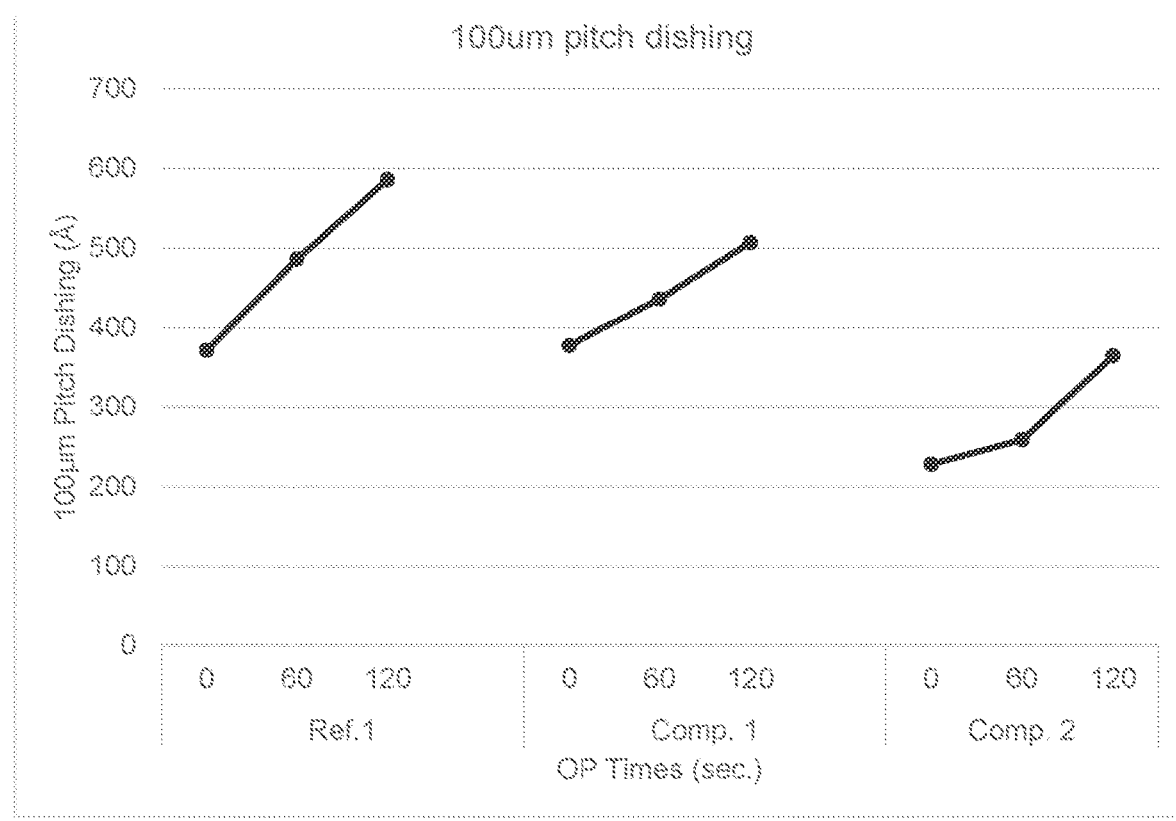
FIG. 2. displays 100 μm Oxide Trench Dishing (Å) vs OP Times (Sec.) using Ref. 1, Comp. 1 and Comp. 2
Figure 3:
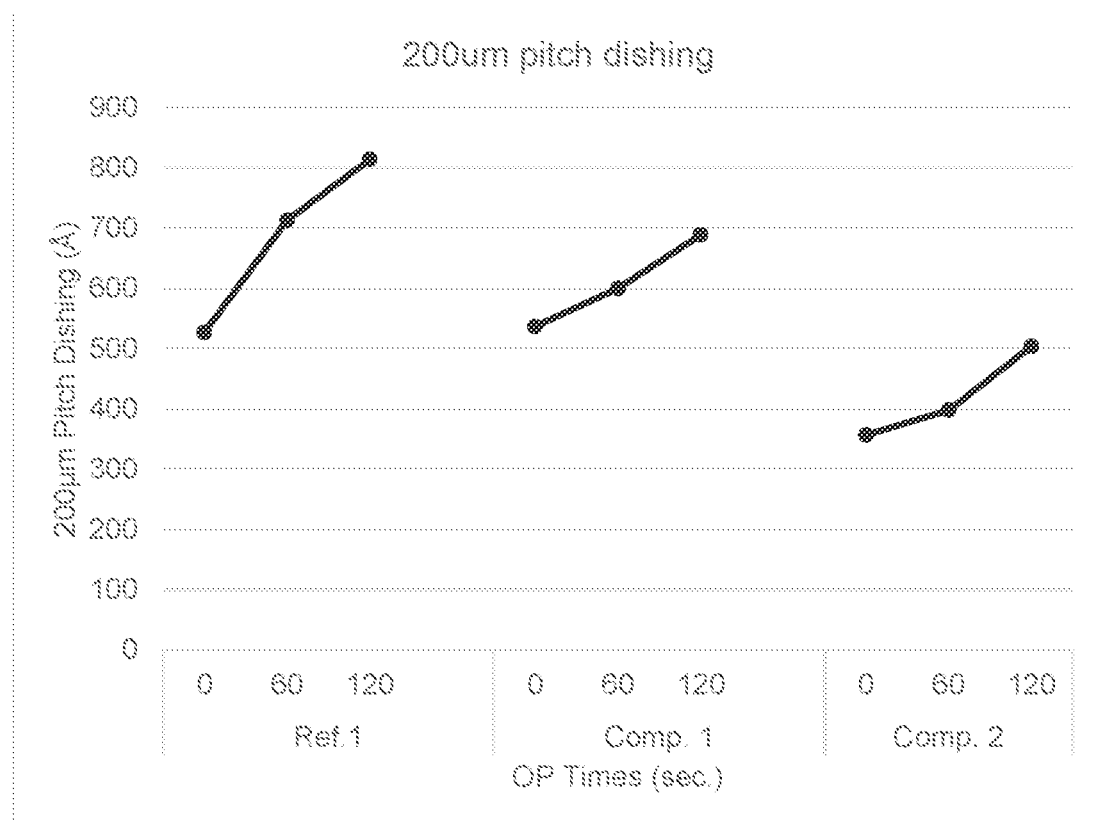
FIG. 3. displays 200 μm Oxide Trench Dishing (Å) vs OP Times (Sec.) using Ref. 1, Comp. 1 and Comp. 2

As the results shown in Table 2, FIG. 2 and FIG. 3, the addition of Silamine® AS at 0.01 wt. % to form dual additives based polishing compositions reduced oxide trench dishing vs different over polishing times on both 100 µm and 200 µm pitch features while comparing the reference sample which only used ceria-coated silica abrasives and 0.15 wt. % D-sorbitol.

TABLE 2

Effects of Dual Additive Polishing Compositions on
Oxide Trench Dishing (Å) vs OP Times (Sec.)

| Composition | OP Times (Sec.) | 100 um pitch dishing | 200 um pitch dishing |
|---|---|---|---|
| Ref. 1 | 0 | 371 | 527 |
|  | 60 | 486 | 713 |
|  | 120 | 586 | 814 |
| Comp. 1 | 0 | 377 | 537 |
|  | 60 | 436 | 600 |
|  | 120 | 507 | 689 |
| Comp. 2 | 0 | 228 | 357 |
|  | 60 | 259 | 398 |
|  | 120 | 364 | 504 |

The addition of Silamine® C-100 at 0.0075 wt. % to form dual additives based polishing compositions significantly reduced oxide trench dishing vs different over polishing times on both 100 µm and 200 µm pitch features while comparing the reference sample which only used ceria-coated silica abrasives and 0.15 wt. % D-sorbitol.

The effects of adding Silamine AS at 0.01 wt. % or adding Silamine® C-100 at 0.0075 wt. % respectively to form dual additives based polishing compositions on the oxide trenching dishing rate were tested and the results were listed in Table 3.

TABLE 3

Effects of Dual Additives at pH 5.35 on Oxide Dishing Rate

| Composition | P100 Dishing (Å/sec.) | P200 Dishing (Å/sec.) |
|---|---|---|
| Ref. 1 | 3.4 | 4.1 |
| Comp. 1 | 2 | 2.1 |
| Comp. 2 | 2.6 | 2.8 |

As the results shown in Table 3, the addition of Silamine® C-100 at 0.01 wt. % or Silamine® C-100 at 0.0075 wt. % respectively to form dual additives based polishing compositions significantly reduced oxide dishing rates.

The effects of the addition of Silamine® C-100 at 0.01 wt. % or Silamine® C-100 at 0.0075 wt. % respectively to form dual additives based polishing compositions on the slopes of oxide trenching dishing vs over polishing amounts were tested and the results were listed in Table 4.

TABLE 4

Effects of Dual Additives on the Slopes of Trench
Dishing vs Over Polishing Amounts

| Compositions | P100 Dishing/OP Amt. Slope | P200 Dishing/OP Amt. Slope |
|---|---|---|
| Ref. 1 | 0.03 | 0.04 |
| Comp. 1 | 0.02 | 0.03 |
| Comp. 2 | 0.02 | 0.02 |

As the results shown in Table 4, the addition of Silamine® C-100 at 0.01 wt. % or Silamine® C-100 as 0.0075 wt. % respectively to form dual additives based polishing compositions reduced the slopes of oxide dishing vs over polishing amounts.

Example 3

In Example 3, The same polishing compositions used in Example 1 were used for testing the total defect counts on the polished TEOS and SiN wafers.

The results were shown in Table 5.

TABLE 5

Effects of Dual Additives vs Single Additive on Total Defect Counts

| Compositions | TEOS 0.13 um LPD | TEOS 0.07 um LPD | LPCVD SIN 0.11 um LPD |
|---|---|---|---|
| Ref. 1 | 457 | 11388 | 220 |
| Comp. 1 | 315 | 4986 | 142 |
| Comp. 2 | 145 | 4910 | 119 |

As the results shown in Table 5, the total defect counts on the polished TEOS and LPCVD wafers were significantly reduced with the addition of Silamine®.

Example 4

In Example 4, the polishing compositions used for oxide polishing were shown in Table 6.

Reference 2 (Ref. 2) was made using 0.2 wt. % ceria-coated silica, a biocide ranging from 0.0001 wt. % to 0.05 wt. %, 0.025 wt. % Silamine® C-100, and deionized water at pH 5.35.

The working composition (Comp. 3) was made using 0.2 wt. % ceria-coated silica, a biocide ranging from 0.0001 wt. % to 0.05 wt. %, 0.15 wt. % D-sorbitol, 0.025 wt. % of Silamine® C-100, and deionized water at pH 5.35.

The removal rates (RR at Å/min) for different films were tested. The effects of dual chemical additives, Silamine® C-100 and D-sorbitol based polishing composition vs reference samples on the film removal rates and HDP: SiN selectivity were tested and listed in Table 6.

TABLE 6

Effects of dual chemical additives on film RR (A/min.) & HDP: SiN Selectivity

| Compositions | HDP RR (Å/min.) | LPCVD SIN RR (Å/min) | HDP: SIN Selectivity |
|---|---|---|---|
| Ref. 1 | 2710 | 40 | 68:1 |
| Ref. 2 (0.2% Ceria-coated Silica + 0.025% Silamine ® C-100) | 2095 | 297 | 7:1 |
| Comp. 3 (0.2% Ceria-coated Silica + 0.15% D-Sorbitol + 0.025% Silamine ® C-100) | 2147 | 26 | 83:1 |

As the results shown in Table 6, Ref. 2 using 0.025 wt. % Silamine® C-100 as only chemical additive had the highest LPCVD SiN film removal rates, which is much higher than the SiN removal rates obtained from Ref.1 which used D-sorbitol as only chemical additive and the working sample which used dual chemical additives, D-sorbitol and Silamine® C-100.

TABLE 7

Effects of Dual Additive Polishing Compositions on Oxide Trench Dishing (Å) vs OP Times (Sec.)

| Compositions | OP Times (Sec.) | 100 um pitch dishing | 200 um pitch dishing | 1000 um pitch dishing |
|---|---|---|---|---|
| Ref. 1 | 0 | 139 | 306 | 816 |
|  | 60 | 246 | 401 | 991 |
|  | 120 | 355 | 533 | 1128 |
| Ref. 2 | 0 | 180 | 339 | 634 |
|  | 60 | 568 | 751 | 1101 |
|  | 120 | 880 | 1106 | 1507 |
| Comp. 3 | 0 | 97 | 190 | 561 |
|  | 60 | 154 | 248 | 632 |
|  | 120 | 218 | 298 | 697 |

The dual chemical additives based polishing composition Comp. 3 effectively suppressed LPCVD SiN film removal rates and increased HDP: SiN polishing selectivity from 7:1 for Ref. 2 and 68:1 for Ref. 1 to 83:1.

Figure 4:
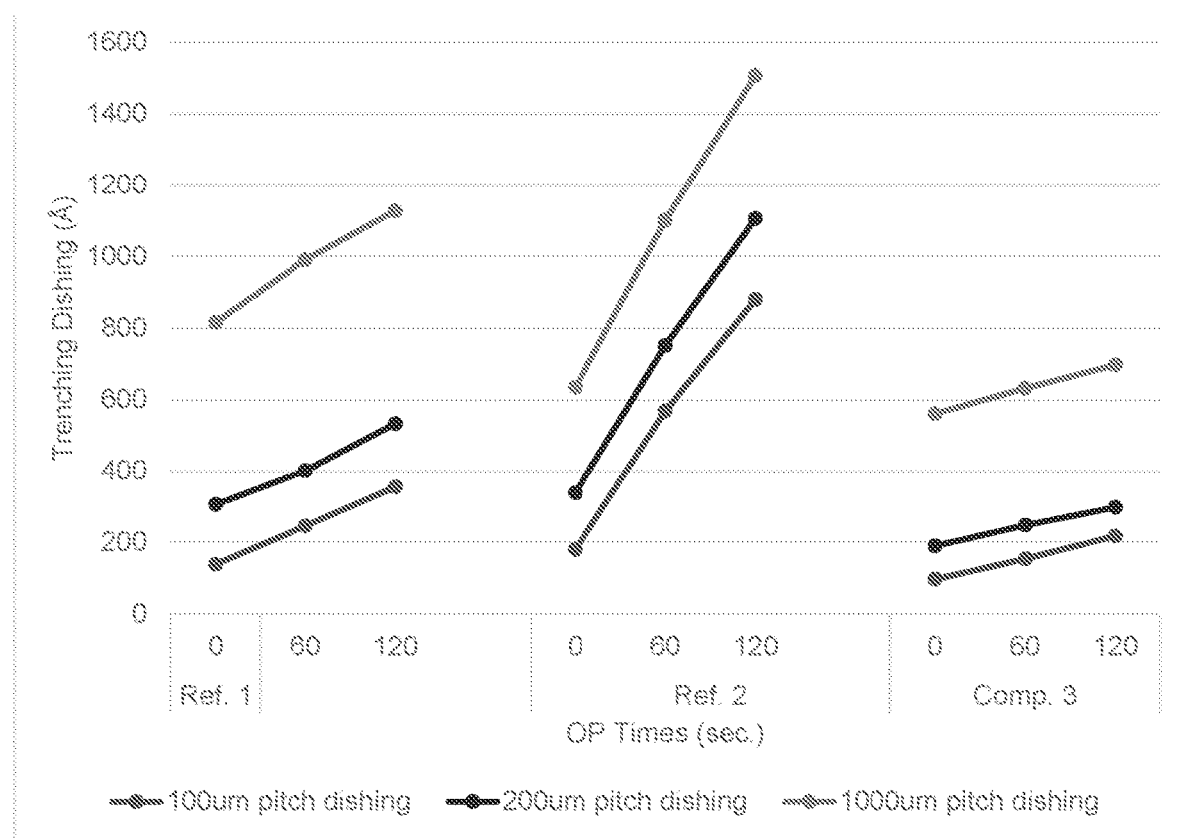
FIG. 4. displays Oxide Trench Dishing (Å) vs OP Times (Sec.) using Ref. 1, Ref. 2, and Comp. 3

In Example 4, the same polishing compositions were used for oxide patterned wafer polishing and 100 μm, 200 μm and 1000 μm oxide trench dishing vs over polishing times, results were shown in Table 7 and depicted in FIG. 4.

As the results shown in Table 7 and FIG. 4, the dual chemical additives based working sample significantly reduced oxide trench dishing on different sized pitches vs different over polishing times while comparing with the single chemical additive based Ref.1 and Ref, 2

The oxide trenching dishing rates were tested using all samples, and the results were listed in Table 8.

The dual chemical additives based polishing composition Comp. 3 significantly reduced oxide trench dishing rates on different sized pitches while comparing oxide trench dishing rates obtained for the reference samples.

The slopes of oxide trenching dishing vs over polishing amounts from all samples were tested and the results were listed in Table 9.

TABLE 8

Effects of Dual Additives at pH 5.35 on Oxide Dishing Rate

| Compositions | P100 Dishing (Å/sec.) | P200 Dishing (Å/sec.) | P1000 Dishing (Å/sec.) |
|---|---|---|---|
| Ref. 1 | 1.8 | 1.9 | 2.6 |
| Ref. 2 | 5.8 | 6.4 | 7.3 |
| Comp. 3 | 1 | 0.9 | 1.1 |

The slopes of oxide trenching dishing vs over polishing amounts from all samples were tested and the results were listed in Table 9.

As the results shown in Table 9, the dual chemical additive based polishing composition (Comp. 3) reduced the slopes of oxide dishing vs over polishing amounts while comparing the slopes of oxide dishing vs over polishing amounts obtained for the reference samples.

TABLE 9

Effects of Dual Additives on the Slopes of Trench Dishing vs Over Polishing Amounts

| Compositions | P100 Dishing/OP Amt. Slope | P200 Dishing/OP Amt. Slope | P1000 Dishing/OP Amt. Slope |
|---|---|---|---|
| Ref. 1 | 0.06 | 0.06 | 0.07 |
| Ref. 2 | 0.31 | 0.33 | 0.34 |
| Comp. 3 | 0.05 | 0.04 | 0.05 |

Example 5

In Example 5, the polishing compositions used for oxide polishing were shown in Table 10.

The Reference 4 (Ref. 4) was made using 0.4 wt. % ceria-coated silica, 0.275 wt. % D-sorbitol, 0.0001 wt. % to 0.05 wt. % biocide, and deionized water. The working compositions Comp. 4 and Comp. 5 were made by adding 0.0125 wt. % of Silsurf® E608 or Silsurf® A208 into the Reference 4, respectively. All samples has a pH of 5.35.

TABLE 10

Removal Rate(RR)(Å/min.); Removal Rate (RR) Selectivity HDP: SiN and TEOS: SIN Selectivity

| Composition | HDP RR (Å/min.) | TEOS RR (Å/min) | PECVD SIN RR (Å/min) | HDP: SIN Selectivity | TEOS: SIN Selectivity |
|---|---|---|---|---|---|
| Ref. 4 (0.4% Ceria-coated Silica + 0.275% D-Sorbitol ) | 3400 | 3389 | 76 | 45:1 | 45:1 |
| Comp. 4 (Ref. 4 + 0.0125% Silsurf ® E608) | 3075 | 2955 | 46 | 67:1 | 64:1 |
| Comp. 5 (Ref. 4 + 0.0125% Silsurf ® A208) | 3024 | 2897 | 41 | 74:1 | 71:1 |

The removal rates (RR at Å/min) for different films were tested. Results were listed in Table 10 and depicted in FIG. 5

Figure 5:
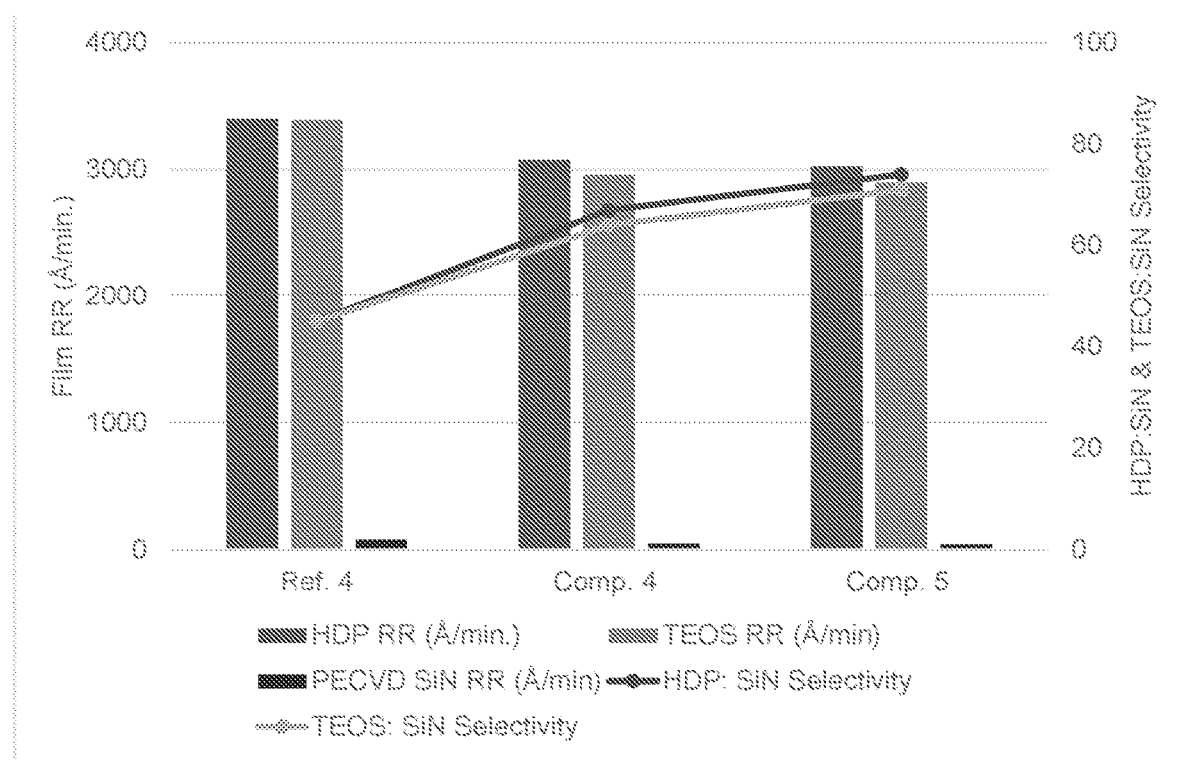
FIG. 5. displays Removal rate (Å/min.) and Removal rate Selectivity for HDP: SiN Films and TEOS: SiN using Ref. 4, Comp. 4, and Comp. 5

As the results shown in Table 10 and FIG. 5, the addition of 0.0125 wt. % Silsurf® E608 or Silsurf® A208 into the polishing composition effectively suppressed PECVD SiN film removal rates and increased polishing selectivities of HDP: SiN and TEOS: SiN.

With the addition of 0.0125 wt. % Silsurf® E608, the HDP: SiN polishing selectivity was increased from 45:1 to 67:1; and the TEOS: SiN polishing selectivity was increased from 45:1 to 64:1.

With the addition of 0.0125 wt. % Silsurf® A208, the HDP: SiN polishing selectivity was increased from 45:1 to 74:1; and the TEOS: SiN polishing selectivity was increased from 45:1 to 71:1.

Example 6

In Example 6, the polishing compositions used for oxide polishing were shown in Table 11.

The Reference sample was made using 0.2 wt. % ceria-coated silica, 0.28 wt. % lactitol, 0.0001 wt. % to 0.05 wt. % biocide, and deionized water. The working samples were made by adding 0.025 wt. % of Silsurf® E608 or 0.025 wt. % Silsurf® A208 into the Reference sample, respectively. All samples were at pH 5.35.

TABLE 11

Removal Rate(RR)(Å/min.); Removal Rate (RR) Selectivity HDP: SiN and TEOS: SIN Selectivity

| Composition | HDP RR (Å/min.) | TEOS RR (Å/min) | PECVD SIN RR (Å/min) | HDP: SIN Selec-tivity | TEOS: SIN Selec-tivity |
|---|---|---|---|---|---|
| Ref. 5 (0.2% Ceria-coated Silica + 0.28% lactitol) | 2465 | 2614 | 63 | 39:1 | 41:1 |
| Comp. 6 (Ref.5 + 0.025% Silsurf® E608) | 2065 | 2090 | 35 | 59:1 | 60:1 |
| Comp. 7 (Ref. 5 + 0.025% Silsurf® A208) | 1904 | 2005 | 26 | 73:1 | 77:1 |

The removal rates (RR at Å/min) for different films were tested. Results were listed in Table 11 and depicted in FIG. 6.

Figure 6:
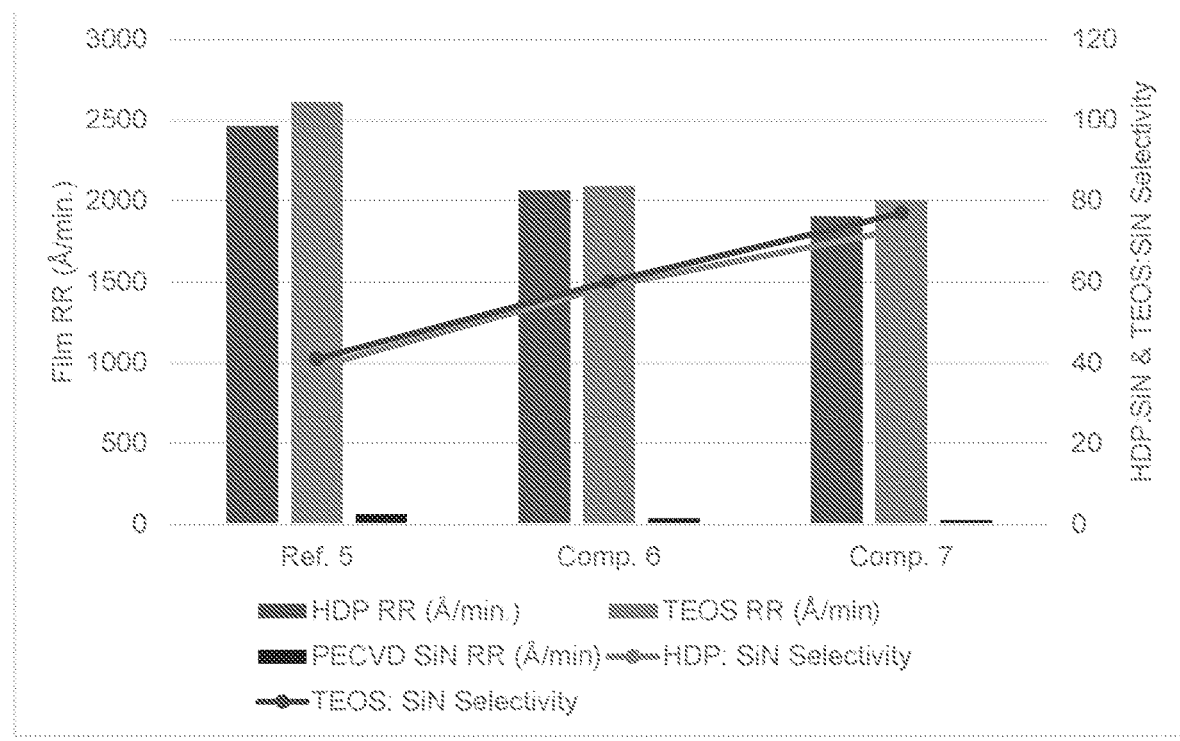
FIG. 6. displays Removal rate (A/min.) and Removal rate Selectivity for HDP: SiN Films and TEOS: SiN using Ref. 5, Comp. 6, and Comp. 7

As the results shown in Table 11 and FIG. 6, the addition of Silsurf® E608 or Silsurf® A208 into the polishing composition effectively suppressed PECVD SiN film removal rates and increased HDP: SiN or TEOS: SiN polishing selectivity.

With the addition of 0.025 wt. % Silsurf® E608, the HDP: SiN polishing selectivity was increased from 39:1 to 59:1; and the TEOS: SiN polishing selectivity was increased from 41:1 to 60:1.

With the addition of 0.025 wt. % Silsurf® A208, the HDP: SiN polishing selectivity was increased from 39:1 to 73:1; and the TEOS: SiN polishing selectivity was increased from 41:1 to 77:1.

Example 7

Figure 7:
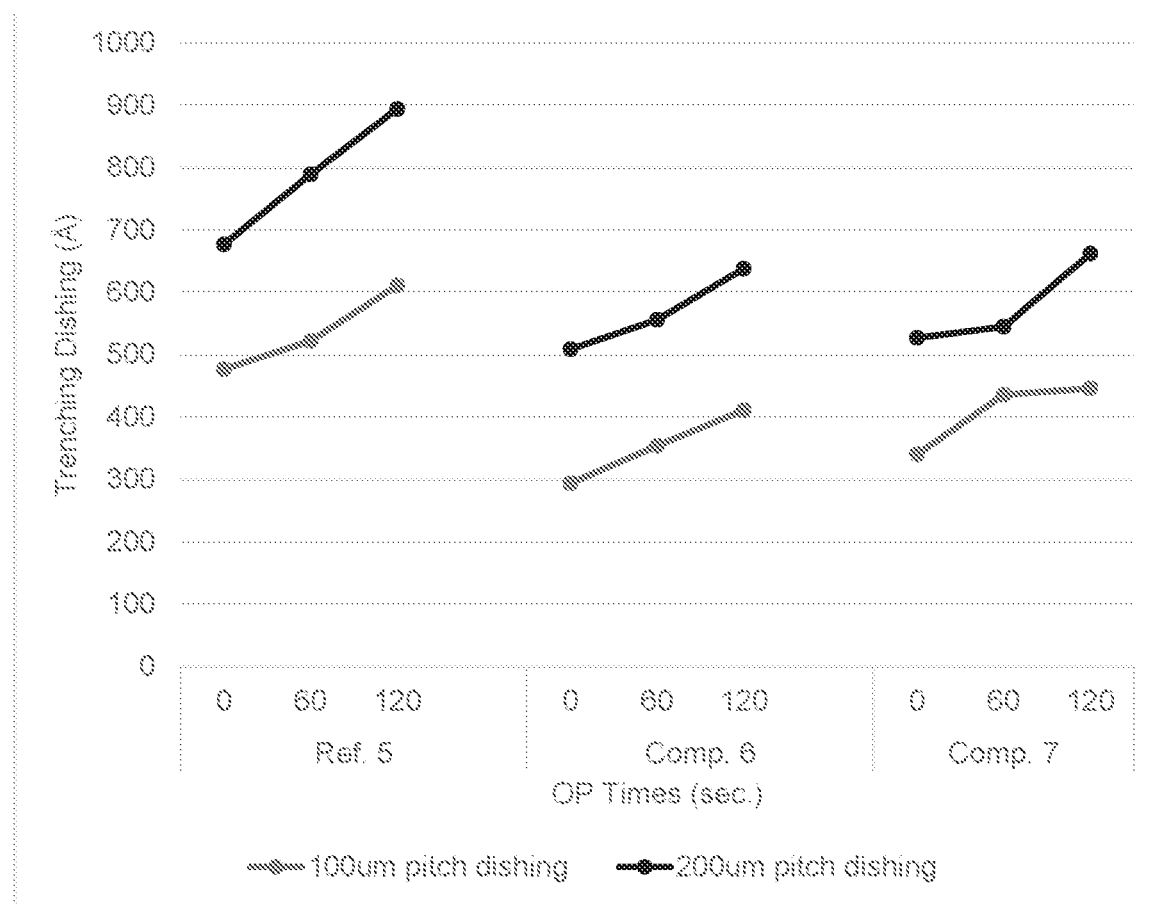
FIG. 7. displays Oxide Trench Dishing (Å) vs OP Times (Sec.) for 100 μm and 200 μm using Ref. 5, Comp. 6, and Comp. 7

In Example 7, the same polishing compositions used in Example 6 were used for polishing oxide patterned wafer. 100 μm and 200 μm oxide trench dishing vs over polishing times were shown in Table 12 and depicted in FIGS. 7.

As the results shown in Table 12 and FIG. 7, the addition of Silsurf® E608 at 0.025 wt. % to form dual additives based polishing compositions with lactitol reduced oxide trench dishing vs different over polishing times on both 100 μm and 200 μm pitch features while comparing the reference sample which only used ceria-coated silica abrasives and 0.28 wt. % lactitol.

TABLE 12

Oxide Trench Dishing (Å) vs OP Times (Sec.)

| Composition | OP Times (Sec.) | 100 um pitch dishing | 200 um pitch dishing |
|---|---|---|---|
| Ref. 5 | 0 | 477 | 677 |
|  | 60 | 522 | 789 |
|  | 120 | 611 | 894 |
| Comp. 6 | 0 | 294 | 509 |
|  | 60 | 354 | 556 |
|  | 120 | 411 | 638 |
| Comp. 7 | 0 | 340 | 527 |
|  | 60 | 436 | 545 |
|  | 120 | 446 | 662 |

As the results shown in Table 12 and FIG. 7, the addition of Silsurf® A208 at 0.025 wt. % to form dual additives based polishing compositions with lactitol reduced oxide trench dishing vs different over polishing times on both 100 μm and 200 μm pitch features while comparing the reference sample which only used ceria-coated silica abrasives and 0.28 wt. % lactitol.

The effects of adding Silsurf® E608 at 0.025 wt. % or adding Silsurf® A208 at 0.025 wt. % respectively with lactitol to form dual additives based polishing compositions on the oxide trenching dishing rate were tested and the results were listed in Table 13.

As the results shown in Table 13, the addition of Silsurf E608 at 0.025 wt. % or Silsurf® A208 at 0.025 wt. % respectively with 0.28 wt. % lactitol to form dual additives based polishing compositions reduced oxide dishing rates.

TABLE 13

Oxide Trench Dishing Rate at pH 5.35

| Composition | P100 Dishing Rate (Å/sec.) | P200 Dishing Rate (Å/sec.) |
|---|---|---|
| Ref. 5 | 1.1 | 1.8 |
| Comp. 6 | 1 | 1.1 |
| Comp. 7 | 0.9 | 1.1 |

The effects of adding Silsurf® E608 at 0.025 wt. % or adding Silsurf® A208 at 0.025 wt. % respectively with 0.28 wt. % lactitol to form dual additives based polishing compositions on the oxide trenching loss rate were tested and the results were listed in Table 14.

As the results shown in Table 14, the addition of Silsurf® E608 at 0.025 wt. % or Silsurf® A208 at 0.025 wt. % respectively with 0.28 wt. % lactitol to form dual additives based polishing compositions reduced oxide trench loss rates.

The effects of adding Silsurf® E608 at 0.025 wt. % or adding Silsurf A208 at 0.025 wt. % respectively with 0.28 wt. % lactitol to form dual additives based polishing compositions on the SiN loss rate were tested and the results were listed in Table 15.

TABLE 14

Oxide Trench Loss Rate at pH 5.35

| Composition | P100 Trench Loss Rate (Å/sec.) | P200 Trench Loss Rate (Å/sec.) |
|---|---|---|
| Ref. 5 | 2.5 | 2.9 |
| Comp. 6 | 1.9 | 2.1 |
| Comp. 7 | 1.6 | 1.8 |

As the results shown in Table 15, the addition of Silsurf® E608 at 0.025 wt. % or Silsurf® A208 at 0.025 wt. % respectively with 0.28 wt. % lactitol to form dual additives based polishing compositions reduced SiN loss rates.

TABLE 15

SiN Loss Rate at pH 5.35

| Compositions | P100 SIN Loss Rate (Å/sec.) | P200 SIN Loss Rate (Å/sec.) |
|---|---|---|
| Ref. 5 | 0.9 | 1.0 |
| Comp. 6 | 0.8 | 0.8 |
| Comp. 7 | 0.6 | 0.6 |

The effects of adding Silsurf® E608 at 0.025 wt. % or adding Silsurf® A208 at 0.025 wt. % respectively with 0.28 wt. % lactitol to form dual additives based polishing compositions on the oxide trenching vs blanket ratio were tested and the results were listed in Table 16.

As the results shown in Table 16, the addition of Silsurf® E608 at 0.025 wt. % or Silsurf® A208 at 0.025 wt. % respectively with 0.28 wt. % lactitol to form dual additives based polishing compositions reduced oxide trench vs blanket ratios.

In general, the lower of the oxide trench vs blanket ratios are, the lower of the oxide trench dishing are.

TABLE 16

Oxide Trench vs Blanket Ratios at pH 5.35

| Compositions | P100 Trench/Blanket Ratio | P200 Trench/Blanket Ratio |
|---|---|---|
| Ref. 5 | 0.06 | 0.07 |
| Comp. 6 | 0.05 | 0.06 |
| Comp. 7 | 0.05 | 0.06 |

Example 8

In general, suppressing SiN film removal rate and increasing removal rate selectivity of HDP: SiN or TEOS: SiN improve STI polishing performances in reducing erosions and trench dishing.

Some chemical additives in the STI polishing suppress SiN removal rates more at relative lower down force comparing with at increased down forces. It is important to select chemical additives which can provide suppressed SiN removal rates and high removal rate selectivity of HDP: SiN or TEOS: SiN at both low and high applied down forces for reduced erosions and oxide trench dishing.

In Example 8, the Reference 6 (Ref. 6) was made using 0.2 wt. % ceria-coated silica and 0.28 wt. % maltitol, and deionized water. The working compositions Comp. 8, Comp. 9, Comp. 10, and Comp. 11 were made by adding 0.025 wt. % of Silsurf® E608, Silsurf® A208, Silsurf® J208-6, or Silsurf® CR1115 into the Reference 6, respectively. All samples were at pH 5.35.

In Example 8, 2.0 psi down force was applied to polish HDP films. Both 2.0 psi and 5.0 psi down forces were applied to polish PECVD SiN films.

Figure 8:
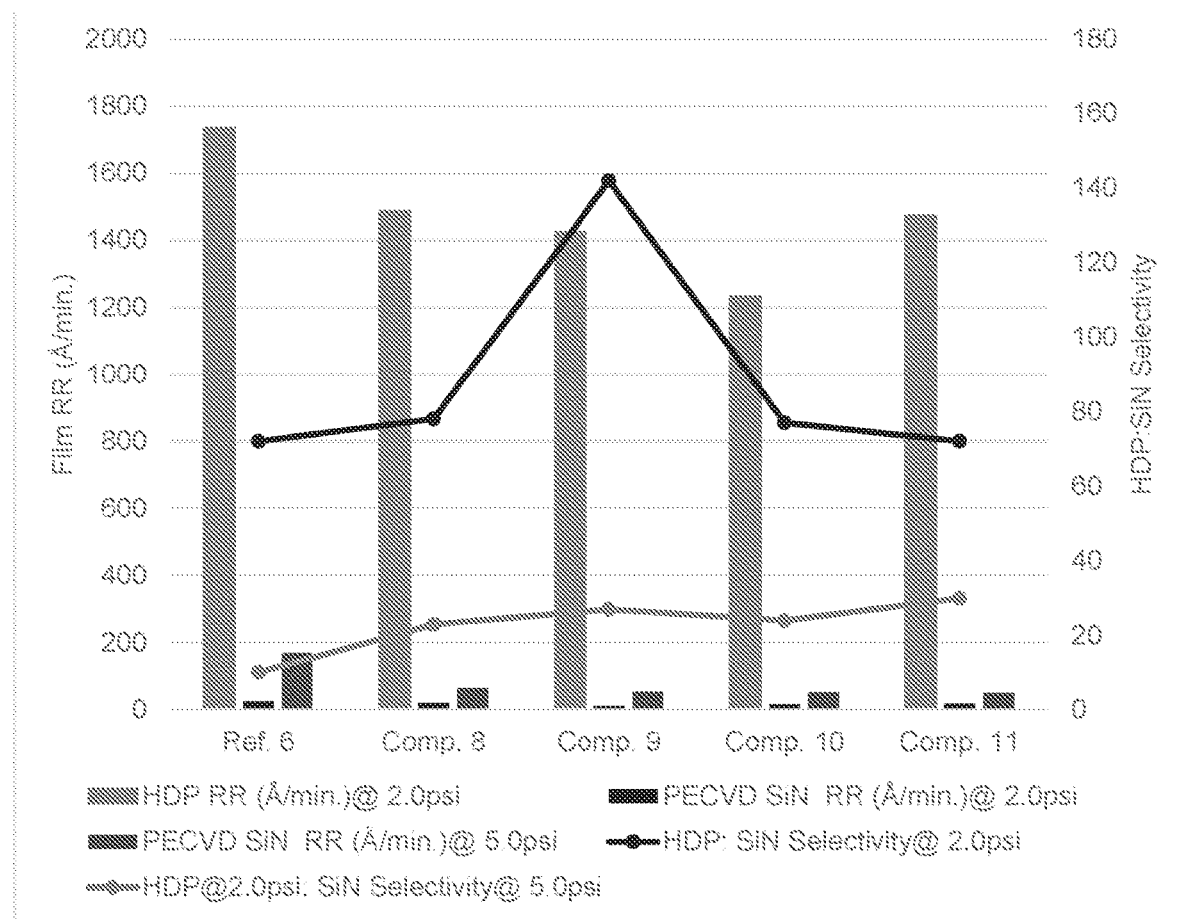
FIG. 8. displays Removal rate (Å/min.) and Removal rate Selectivity for HDP at (@) 2.0 psi: SiN at (@) 5.0 psi using Ref. 6, Comp. 8, Comp. 9, Comp. 10, and Comp. 11

Polishing results showing removal rate (RR) for different films and the RR selectivities at different down forces were shown in Table 17 and FIG. 8.

As the results shown in Table 17 and FIG. 8, all four Silsurf® type chemical additives effectively suppressed PECVD SiN removal rates vs the reference sample, especially, when 5.0 psi high down force was applied for polishing PECVD SiN films.

TABLE 17

Film RR; RR Selectivity of HDP: PECVD SIN

| Composition | HDP RR (Å/min.) @ 2.0 psi | PECVD SiN RR (Å/min.) @ 2.0 psi | HDP:SIN Selectivity 2.0 psi | PECVD SIN RR (Å/min.) @ 5.0 psi | HDP@ 2.0 psi:SIN Selectivity @ 5.0 psi |
|---|---|---|---|---|---|
| Ref. 6 (0.2% Ceria-coated Silica + 0.28% Maltitol) | 1734 | 24 | 72:1 | 169 | 10:1 |
| Comp. 8 (Ref.6 + 0.025% Silsurf® E608) | 1486 | 19 | 78:1 | 65 | 23:1 |
| Comp. 9 (Ref.6 + 0.025% Silsurf® A208) | 1424 | 10 | 142:1 | 53 | 27:1 |
| Comp. 10 (Ref.6 + 0.025% Silsurf® CR1115) | 1232 | 16 | 77:1 | 51 | 24:1 |
| Comp. 11 (Ref.6 + 0.025% Silsurf® J208-6) | 1474 | 18 | 72:1 | 49 | 30:1 |

These Silsurf® type chemical additives increased HDP at 2.0 psi: SiN at 5.0 psi from 10:1 for reference sample without using any Silsurf® type chemical additives to 23:1 to 30:1 range for the polishing compositions used these Silsurf® type chemical additives respectively.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A chemical mechanical polishing composition comprising:
   at least one ceria-coated inorganic oxide particles;
   at least one silicone-containing compound comprising at least one selected from the group consisting of at least one ethylene oxide and propylene oxide (EO-PO) group, and at least one substituted ethylene diamine group;
   at least one non-ionic organic molecule having at least two hydroxyl functional groups;
   solvent;
   optionally,
   a biocide; and
   pH adjuster,
   wherein
   the composition has a pH of 3 to 10, or 4 to 9; and
   the at least one silicone-containing compound has a general molecular structure selected from the group consisting of:

$$H_3C-\underset{\underset{CH_3}{|}}{\overset{\overset{CH_3}{|}}{Si}}-O-\left(\underset{\underset{CH_3}{|}}{\overset{\overset{CH_3}{|}}{Si}}-O\right)_a-\left(\underset{\underset{(H_2C)_n}{|}}{\overset{\overset{CH_2}{|}}{Si}}-O\right)_b-\left(\underset{\underset{(CH_2)_m}{|}}{\overset{\overset{CH_3}{|}}{Si}}-O\right)_c-\left(\underset{\underset{CH_3}{|}}{\overset{\overset{CH_3}{|}}{Si}}-O\right)_{a'}-\underset{\underset{CH_3}{|}}{\overset{\overset{CH_3}{|}}{Si}}-CH_3, \quad (1)$$

wherein a and a' each is independently ranged from 0 to 50, or 0 to 20; wherein at least one of a and a' is not 0;

b and c each is independently ranged from 0 to 50, or 0 to 20; wherein at least one of b and c is not 0;

n and m can be the same or different, and each is independently ranged from 1 to 12, or 1 to 5;

R and R' can be the same or different, and each is independently selected from the group consisting of hydrogen; $-(CH_2)_pCH_3$ with p ranged from 1 to 12 or 2 to 5; $-NH_2$; $-NH(CH_2)_q-NH_2$ with q ranged from 1 to 12 or from 2 to 5; ethylene oxide (EO) and propylene oxide (PO) repeating group $-(EO)_e-(PO)_d$ $-OH$ with d and e each independently selected from the group consisting of from 1 to 50, 1 to 40, 1 to 30, 1 to 20, 1 to 10, and 1 to 5; $-COOH$; $-COOM$; $-COOR^1$; $-R^1COOH$; $-R^1COOM$; $-R_1COOR^2$; $-SO_3H$; $-SO_3M$; $-R_1SO_3H$; phosphonic acid; phosphate salt selected from sodium, potassium or ammonium salts; benzyl; di-benzyl;

wherein $R^1$ and $R_2$ each is independently selected from the group consisting of $-(CH_2)$ m with m ranged from 1 to 12, and $-(C_6H_4)_n$ with n ranged from 1 to 4; and M is selected from the group consisting of sodium, potassium, and ammonium;

$$HO-(CH-CH_2-O)_d-(CH_2-CH_2-O)_e-(CH_2)_3-\underset{\underset{CH_3}{|}}{\overset{\overset{CH_3}{|}}{Si}}-\left(O-\underset{\underset{CH_3}{|}}{\overset{\overset{CH_3}{|}}{Si}}\right)_a-O-\underset{\underset{CH_3}{|}}{\overset{\overset{CH_3}{|}}{Si}}-(CH_2)_3-(OCH_2-CH_2)_e-(O-CH_2-CH)_d-OH, \quad (2)$$
(with $CH_3$ on the first CH and last CH)

wherein a is ranged from 0 to 50, or 0 to 20;

e and d can be the same or different, and each is independently ranged from 1 to 12;

$$(CH_3)_3-Si-O\,[(SiO)_x\,(SiO-(CH_2)_{n-1}-SiO)_y]_z-Si-(CH_3)_3, \quad (3)$$
(with R' substituents on Si positions and R'' substituents)

wherein

R' and R'' can be the same or different, and each is independently selected from the group consisting of hydrogen; $-(CH_2)_pCH_3$ with p ranged from 1 to 12 or 2 to 5; $-NH_2$; $-NH(CH_2)_q-NH_2$ with q ranged from 1 to 12 or from 2 to 5; ethylene oxide (EO) and propylene oxide (PO) repeating group $-(EO)_e-(PO)_d$ $-OH$ with d and e each independently selected from the group consisting of from 1 to 50, 1 to 40, 1 to 30, 1 to 20, 1 to 10, and 1 to 5; $-COOH$; $-COOM$; $-COOR^1$; $-R_1COOH$; $-R_1COOM$; $-R_1COOR^2$; $-SO_3H$; $-SO_3M$; $-R_1SO_3H$; phosphonic acid; phosphate salt selected from sodium, potassium or ammonium salts; benzyl; di-benzyl; wherein $R^1$ and $R^2$ each is independently selected from the group consisting of $-(CH_2)_m$ with m ranged from 1 to 12, and $-(C_6H_4)_n$ with n ranged from 1 to 4; and M is selected from the group consisting of sodium, potassium, and ammonium; and x, y, and z can be the same or different, and each is independently selected from 1 to 12; n–1 is from 2 to 13;

and (4) combinations of (1), (2) and (3).

2. The chemical mechanical polishing composition of claim 1, wherein the ceria-coated inorganic metal oxide particles are selected from the group consisting of ceria-coated colloidal silica, ceria-coated alumina, ceria-coated titania, ceria-coated zirconia particles and combinations thereof, wherein the particles are present in the composition at a range from 0.01 wt. % to 20 wt. %, or 0.025 wt. % to 10 wt. %.

3. The chemical mechanical polishing composition of claim 1, wherein the at least one silicone-containing compound having a general molecular structure (1) is selected from the group consisting of:

$$H_3C-\underset{\underset{CH_3}{|}}{\overset{\overset{CH_3}{|}}{Si}}-O-\left(\underset{\underset{CH_3}{|}}{\overset{\overset{CH_3}{|}}{Si}}-O\right)_a-\left(\underset{\underset{(H_2C)_3}{|}}{\overset{\overset{CH_2}{|}}{Si}}-O\right)_b-\left(\underset{\underset{(CH_2)_3}{|}}{\overset{\overset{CH_3}{|}}{Si}}-O\right)_c-\underset{\underset{CH_3}{|}}{\overset{\overset{CH_3}{|}}{Si}}-CH_3, \quad (a)$$

with side chain $NH-CH_2CH_2-NH_2$ and $(OCH_2CH_2)_e(OCH_2CH_2)_d OH$ group with $CH_3$ wherein a is ranged from 0 to 50, or 0 to 20;

b and c can be the same or different, and each is independently ranged from 0 to 50, or 0 to 20; wherein at least one of b and c is not 0;

and e and d can be the same or different, and each is independently ranged from 1 to 12;

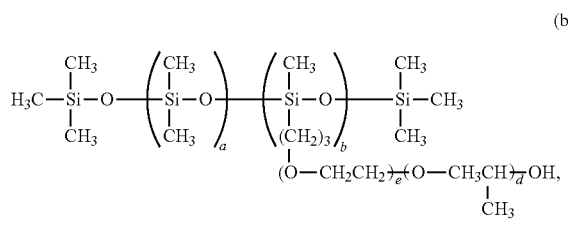
(b)

wherein a is ranged from 0 to 50, or 0 to 20;

b is ranged from 1 to 50, or 1 to 20;

and e and d can be the same or different, and each is independently ranged from 1 to 12;

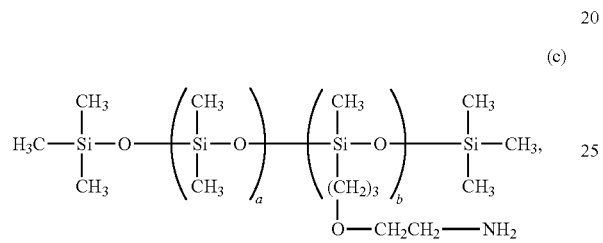
(c)

wherein a is ranged from 0 to 50, or 0 to 20;

b is ranged from 1 to 50, or 1 to 20;

and (d) combinations thereof.

4. The chemical mechanical polishing composition of claim 1, wherein the at least one silicone-containing compound is present in the composition at a concentration of from 0.0001 wt. % to 2.0% wt. %, or from 0.001 wt. % to 1.0 wt.

5. The chemical mechanical polishing composition of claim 1, wherein the at least one non-ionic organic molecule having at least two hydroxyl functional groups has a general molecular structure selected from the group consisting of:

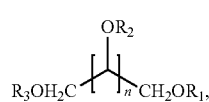
(a)

wherein n is selected from of 2 to 5,000, or 3 to 12; $R_1$, $R_2$, and $R_3$ groups can be the same or different and each is independently selected from the group consisting of hydrogen, an alkyl group $C_nH_{2n+1}$, n is from 1 to 12, or 1 to 6; alkoxy; organic group with one or more hydroxyl groups; substituted organic sulfonic acid; substituted organic sulfonic acid salt; substituted organic carboxylic acid; substituted organic carboxylic acid salt; organic carboxylic ester; organic amine groups; and combinations thereof; wherein, at least two of them are hydrogen atoms;

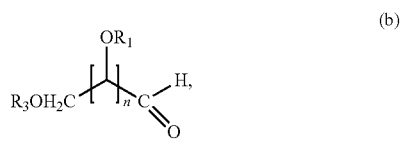
(b)

wherein n is selected from 2 to 5,000, or 3 to 12; each of $R_1$ and $R_2$ can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof;

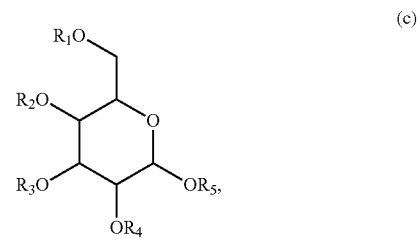
(c)

wherein $R_1$, $R_2$, $R_3$, $R_4$, and $R_5$ can be the same or different and can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein at least two, preferably four or more of them are hydrogen atoms;

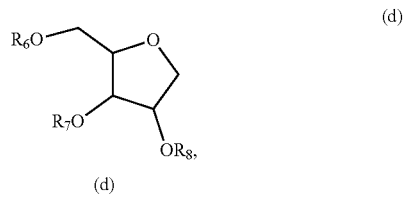
(d)

wherein $R_6$, $R_7$, and $R_8$ can be the same or different and can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two, preferably four or more of them are hydrogen atoms;

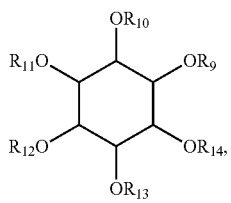
(e)

wherein $R_9$, $R_{10}$, $R_{11}$, $R_{12}$, $R_{13}$, and $R_{14}$ can be the same or different and can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two, preferably four or more of them are hydrogen atoms;

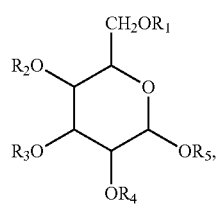
(f)

wherein at least one R in the group of $R_1$ to $R_5$ in the general molecular structure (f) is a polyol molecular unit having a structure shown in (i):

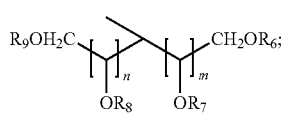
(i)

wherein n and m can be the same or different and is independently from 1 to 5, or 1 to 3; $R_6$ to Ry can be the same or different and are independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof; and at least two of them are hydrogen atoms;

and the rest of each R in the group of $R_1$ to Rs can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, a six-member ring polyol having a structure shown in (ii):

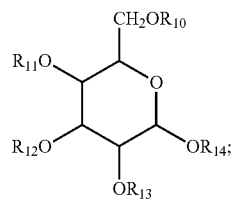
(ii)

wherein the structure (ii) is connected through oxygen carbon bond in structure (f) by removing one R from $R_{11}$ to $R_{14}$ in (ii) and each of the rest $R_{10}$ to $R_{14}$ is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;

and (g) combinations thereof;

and the non-ionic organic molecule has a concentration ranging from 0.001 wt. % to 2.0% wt. %, or from 0.0025 wt. % to 1.0 wt. %.

6. The chemical mechanical polishing composition of claim 1, wherein the at least one non-ionic organic molecule has at least four hydroxyl functional groups.

7. The chemical mechanical polishing composition of claim 1, wherein the at least one non-ionic organic molecule is:

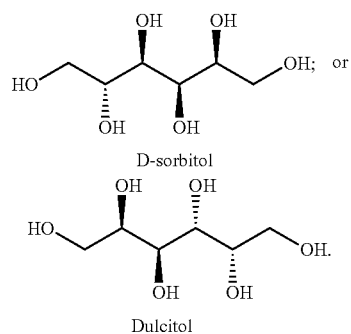

D-sorbitol

Dulcitol

8. The chemical mechanical polishing composition of claim 1, wherein the non-ionic organic molecule is:

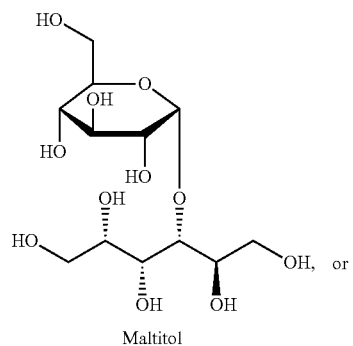

Maltitol

33

-continued

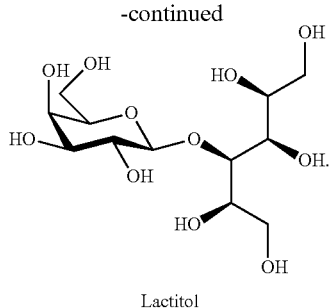

Lactitol

9. The chemical mechanical polishing composition of claim 1, wherein the solvent is selected from the group consisting of deionized water, distilled water, and an alcohol-containing organic solvent.

10. The chemical mechanical polishing composition of claim 1, wherein the composition comprises from 0.0001 wt. % to 0.05 wt. % of the biocide, wherein the biocide comprises 5-chloro-2-methyl-4-isothiazolin-3-one or 2-methyl-1-isothiazolin-3-one.

11. The chemical mechanical polishing composition of claim 1, wherein the composition comprises from 0 wt. % to 1 wt. % pH adjusting agent selected from the group consisting of nitric acid, sulfuric acid, tartaric acid, succinic acid, citric acid, malic acid, malonic acid, various fatty acids, hydrochloric acid, phosphoric acid various polycarboxylic acids, and mixtures thereof for acidic pH conditions; or selected from the group consisting of potassium hydroxide, sodium hydroxide, ammonia hydroxide, tetraethylammonium hydroxide, organic quaternary ammonium hydroxide compounds; ethylenediamine, piperazine, polyethyleneimine, modified polyethyleneimine, and combinations thereof for alkaline pH conditions.

12. The chemical mechanical polishing composition of claim 1,
wherein the chemical mechanical polishing composition comprises ceria-coated colloidal silica;
at least one selected from the group consisting of:

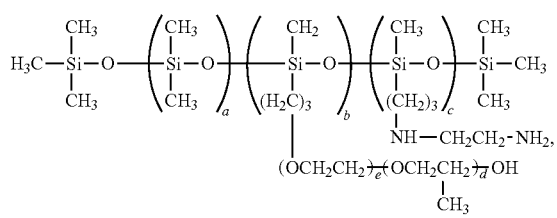

wherein
a is ranged from 0 to 50, or 0 to 20;
b and c can be the same or different, and each is independently selected from 0 to 50, or 0 to 20; wherein at least one of b and c is not 0;

34 and
e and d can be the same or different, and each is independently ranged from 1 to 12;

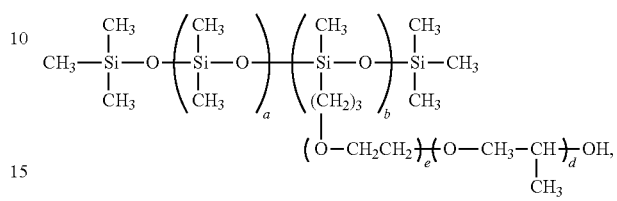

wherein
a is selected from 0 to 50, or 0 to 20;
b is selected from 1 to 50, or 1 to 20;
and
e and d can be the same or different, and each is independently ranged from 1 to 12;

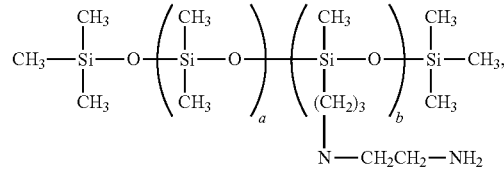

wherein
a is selected from 0 to 50, or 0 to 20;
b is selected from 1 to 50, or 1 to 20;

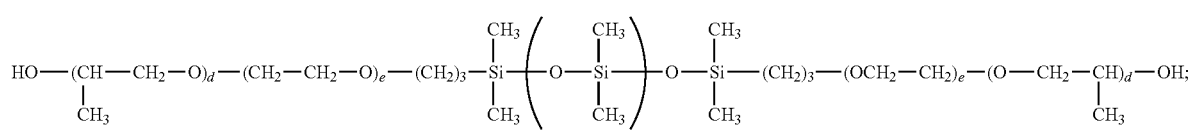

wherein
a is selected from 0 to 50, or 0 to 20;
e and d can be the same or different, and each is independently ranged from 1 to 12;
and
(e) combinations thereof;
at least one selected from the group consisting of Dulcitol, D-sorbitol, Maltitol, Lactitol, and combinations thereof;
deionized water;
and
the pH is from 4 to 9.

13. The chemical mechanical polishing composition of claim 1,
wherein the chemical mechanical polishing composition comprises ceria-coated colloidal silica;

at least one selected from the group consisting of:

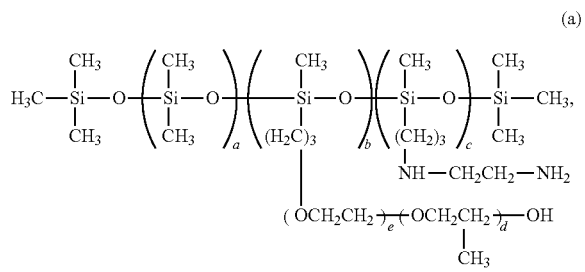
(a)

wherein
a is selected from 0 to 10, or 0 to 5;
b and c can be the same or different, and each is independently selected from 0 to 10, or 0 to 5; wherein at least one of b and c is not 0;
and
e and d can be the same or different, and each is independently ranged from 1 to 12;

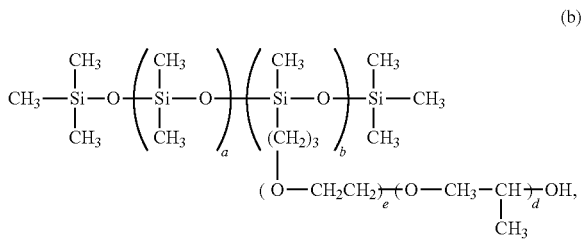
(b)

wherein
a is selected from 0 to 10, and 0 to 5;
b is selected from 1 to 10, or 1 to 5;
and
e and d can be the same or different, and each is independently ranged from 1 to 12;

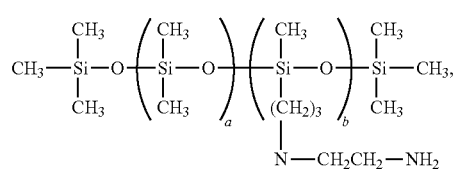
(c)

wherein
a is selected from 0 to 10, or 0 to 5;
b is selected from 1 to 10, or 1 to 5;

wherein
a is selected from 0 to 10, or 0 to 5;
e and d can be the same or different, and each is independently ranged from 1 to 12;
and
(e) combinations thereof;
at least one selected from the group consisting of Dulcitol, D-sorbitol, Maltitol, Lactitol, and combinations thereof;
deionized water;
and
the pH is from 4 to 9.

14. The chemical mechanical polishing composition of claim 1,
wherein the chemical mechanical polishing composition comprises ceria-coated colloidal silica;
at least one selected from the group consisting of:

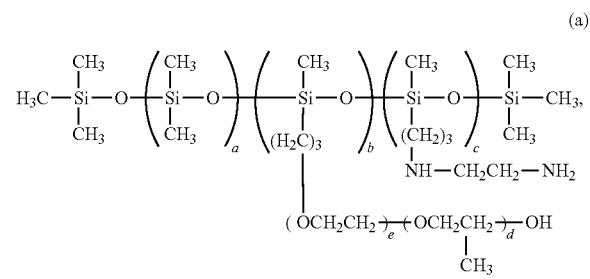
(a)

wherein
a is selected from 0 to 50, or 0 to 20;
b and c can be the same or different, and each is independently selected from f 0 to 50, or 0 to 20; wherein at least one of b and c is not 0;
and
e and d can be the same or different, and each is independently ranged from 1 to 12;

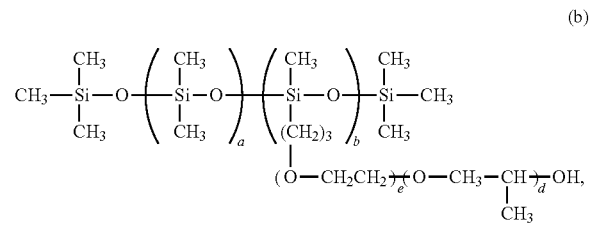
(b)

wherein
a is selected from 0 to 50, or 0 to 20;
b is selected from 1 to 50, or 1 to 20;
and
e and d can be the same or different, and each is independently ranged from 1 to 12;

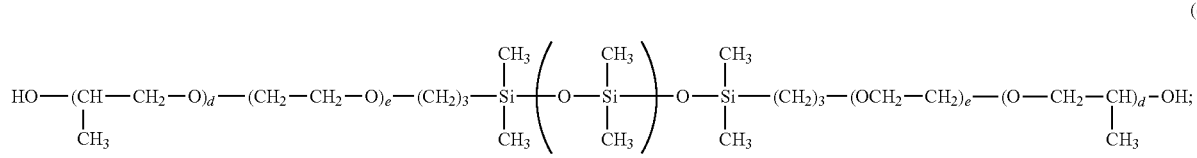
(d)

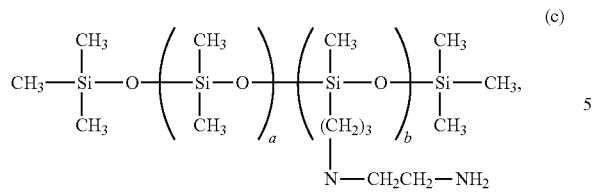
(c)

wherein
a is selected from 0 to 50, or 0 to 20;
b is selected from 1 to 50, or 1 to 20;

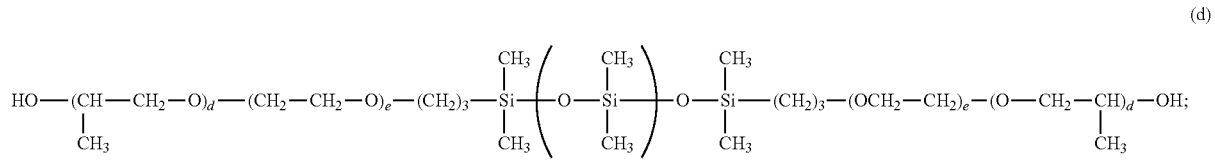
(d)

wherein
a is selected from 0 to 50, or 0 to 20;
e and d can be the same or different, and each is independently ranged from 1 to 12;
and
(e) combinations thereof;
at least one selected from the group consisting of Dulcitol, D-sorbitol, Maltitol, Lactitol, and combinations thereof;
a biocide comprising s 5-chloro-2-methyl-4-isothiazolin-3-one or 2-methyl-1-isothiazolin-3-one;
deionized water;
and
the pH is from 5 to 7.

15. The chemical mechanical polishing composition of claim 1,
wherein the chemical mechanical polishing composition comprises ceria-coated colloidal silica;
at least one selected from the group consisting of:

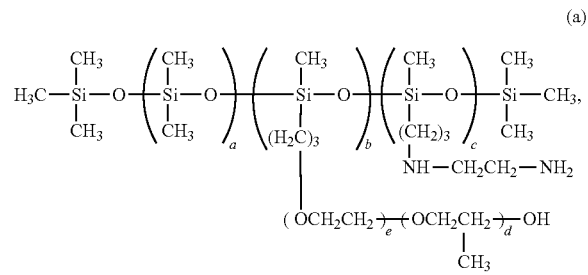
(a)

wherein
a is selected from 0 to 10, or 0 to 5;
b and c can be the same or different, and each is independently selected from 0 to 10, or 0 to 5; wherein at least one of b and c is not 0;
and
e and d can be the same or different, and each is independently ranged from 1 to 12;

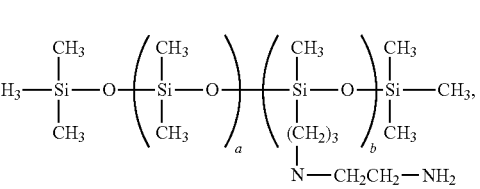
(b)

wherein
a is selected from 0 to 10, and 0 to 5;
b is selected from 1 to 10, or 1 to 5;
and
e and d can be the same or different, and each is independently ranged from 1 to 12;

(c)

wherein
a is selected from 0 to 10, or 0 to 5;
b is selected from 1 to 10, or 1 to 5;

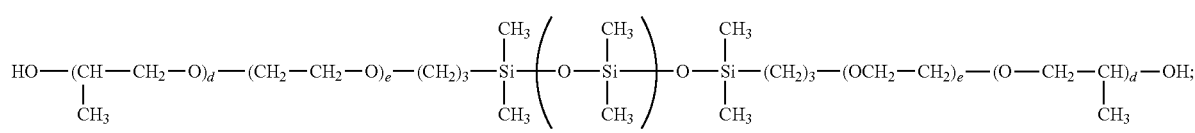
(d)

wherein
a is selected from 0 to 10, or 0 to 5;
e and d can be the same or different, and each is independently ranged from 1 to 12;
and
(e) combinations thereof;
at least one selected from the group consisting of Dulcitol, D-sorbitol, Maltitol, Lactitol, and combinations thereof;
a biocide comprising s 5-chloro-2-methyl-4-isothiazolin-3-one or 2-methyl-1-isothiazolin-3-one;
deionized water;
and
the pH is from 5 to 7.

16. A method of chemical mechanical polishing (CMP) a semiconductor substrate having at least one surface comprising a silicon oxide film, the method comprising the steps of:
providing the semiconductor substrate;
providing a polishing pad;
providing the chemical mechanical polishing (CMP) composition in claim 1;
contacting the surface of the semiconductor substrate with the polishing pad and the chemical mechanical polishing composition; and
polishing the least one surface comprising silicon dioxide.

17. The method of claim 16, wherein the silicon oxide film is high density plasma deposited tetraethyl orthosilicate (TEOS) (HDP) film.

18. The method of claim 16, wherein the silicon oxide film is high density plasma deposited tetraethyl orthosilicate (TEOS) (HDP) film; the semiconductor substrate further comprises a silicon nitride surface; and removal rate of HDP/removal rate of SiN is ≥70, or 120.

19. A system of chemical mechanical polishing (CMP) a semiconductor substrate having at least one surface comprising silicon oxide, the system comprising:
   a. a semiconductor substrate;
   b. the chemical mechanical polishing (CMP) composition in claim 1;
   c. a polishing pad,
      wherein the at least one surface comprising silicon oxide film is in contact with the polishing pad and the chemical mechanical polishing composition.

20. The system of claim 19; wherein the silicon oxide film is high density plasma deposited tetraethyl orthosilicate (TEOS) (HDP) film; the semiconductor substrate further comprises a silicon nitride surface; and removal rate of HDP/removal rate of SiN is ≥70, or 120.

* * * * *